(12) United States Patent
Jei et al.

(10) Patent No.: US 10,310,924 B2
(45) Date of Patent: Jun. 4, 2019

(54) STORAGE DEVICE AND READ RECLAIM METHOD THEREOF

(71) Applicants: Hyun-Seung Jei, Osan-si (KR); Heewon Lee, Suwon-si (KR); Suejin Kim, Bucheon-si (KR)

(72) Inventors: Hyun-Seung Jei, Osan-si (KR); Heewon Lee, Suwon-si (KR); Suejin Kim, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 137 days.

(21) Appl. No.: 15/376,227

(22) Filed: Dec. 12, 2016

(65) Prior Publication Data

US 2017/0177425 A1    Jun. 22, 2017

(30) Foreign Application Priority Data

Dec. 18, 2015 (KR) .................. 10-2015-0181872

(51) Int. Cl.
*G06F 11/07* (2006.01)
*G06F 11/10* (2006.01)
(Continued)

(52) U.S. Cl.
CPC ........ *G06F 11/076* (2013.01); *G06F 11/0727* (2013.01); *G06F 11/0751* (2013.01);
(Continued)

(58) Field of Classification Search
CPC ............... G06F 11/076; G06F 11/0751; G06F 11/0727; G06F 11/1072; G06F 11/102;
(Continued)

(56) References Cited

U.S. PATENT DOCUMENTS 7,679,133 B2   3/2010   Son et al.
8,316,278 B2   11/2012  Ahn et al.
(Continued)

OTHER PUBLICATIONS

H. Park, J. Kim, J. Choi, D. Lee and S. H. Noh, "Incremental redundancy to reduce data retention errors in flash-based SSDs," 2015 31st Symposium on Mass Storage Systems and Technologies (MSST), Santa Clara, CA, 2015, pp. 1-13.*

(Continued)

*Primary Examiner* — Cynthia Britt
(74) *Attorney, Agent, or Firm* — Volentine, Whitt & Francos, PLLC

(57) ABSTRACT

A read reclaim method of a storage device includes detecting, at a cycle of a random number of read operations, the number of error bits within non-selection data stored in each of a plurality of memory blocks. A memory block having the number of detected error bits, with respect to the number of read operations, increasing at a rate greater than a reference rate over one or more cycles of the random number of read operations is selected as a weak block. The number of error bits within non-selection data stored in the weak block is detected at a cycle of a fixed number of read operations. A detection is made of whether the number of error bits detected according to the fixed-number cycle is greater than or equal to a read reclaim reference. The non-selection data is data not requested by a host.

17 Claims, 27 Drawing Sheets

(51) Int. Cl.
*G11C 29/52* (2006.01)
*G11C 16/34* (2006.01)
*G11C 29/04* (2006.01)

(52) U.S. Cl.
CPC ........ *G06F 11/102* (2013.01); *G06F 11/1048* (2013.01); *G06F 11/1072* (2013.01); *G11C 16/3495* (2013.01); *G11C 29/52* (2013.01); *G11C 2029/0409* (2013.01); *G11C 2029/0411* (2013.01)

(58) Field of Classification Search
CPC ............ G11C 29/52; G11C 2029/0411; G11C 2029/0409
See application file for complete search history.

(56) References Cited

U.S. PATENT DOCUMENTS

| | | | |
|---|---|---|---|
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,689,082 | B2 | 4/2014 | Oh et al. |
| 8,793,556 | B1 | 7/2014 | Northcott et al. |
| 8,838,656 | B1 | 9/2014 | Cheriton |
| 2008/0155175 | A1 | 6/2008 | Sinclair et al. |
| 2010/0235713 | A1 | 9/2010 | Lee et al. |
| 2011/0233648 | A1 | 9/2011 | Seol et al. |
| 2014/0101372 | A1 | 4/2014 | Jung |
| 2014/0223246 | A1 | 8/2014 | Kim et al. |
| 2014/0237165 | A1 | 8/2014 | Seo et al. |
| 2014/0310448 | A1* | 10/2014 | Nam .................. G11C 11/5628 711/103 |
| 2015/0012685 | A1 | 6/2015 | Avila et al. |
| 2015/0220276 | A1 | 8/2015 | Moon et al. |
| 2016/0104539 | A1* | 4/2016 | Kim ....................... G11C 16/28 365/185.12 |

OTHER PUBLICATIONS

Y. Cai et al., "Flash correct-and-refresh: Retention-aware error management for increased flash memory lifetime," 2012 IEEE 30th International Conference on Computer Design (ICCD), Montreal, QC, 2012, pp. 94-101.*

N. Mielke et al., "Bit error rate in NAND Flash memories," 2008 IEEE International Reliability Physics Symposium, Phoenix, AZ, 2008, pp. 9-19.*

* cited by examiner

| BLK Add | RC (Read Count) | nEB | EB Increase Rate | BLK Classification |
|---|---|---|---|---|
| BLK0 | 3N | 0 | $\beta$ ($\beta < R$) | NB |
| BLK1 | N-2 | 2 | - | Not decided |
| BLK2 | 3N+1 | TH0-2 | $\alpha$ ($\alpha > R$) | WB |
| BLK3 | 4N+5 | 5 | $\gamma$ ($\gamma < R$) | NB |
| BLK4 | 4N+3 | 1 | $\delta$ ($\delta < R$) | NB |
| ... | ... | ... | ... | ... |
| BLKm | 6N_1 | 6 | $\varepsilon$ ($\varepsilon < R$) | NB |

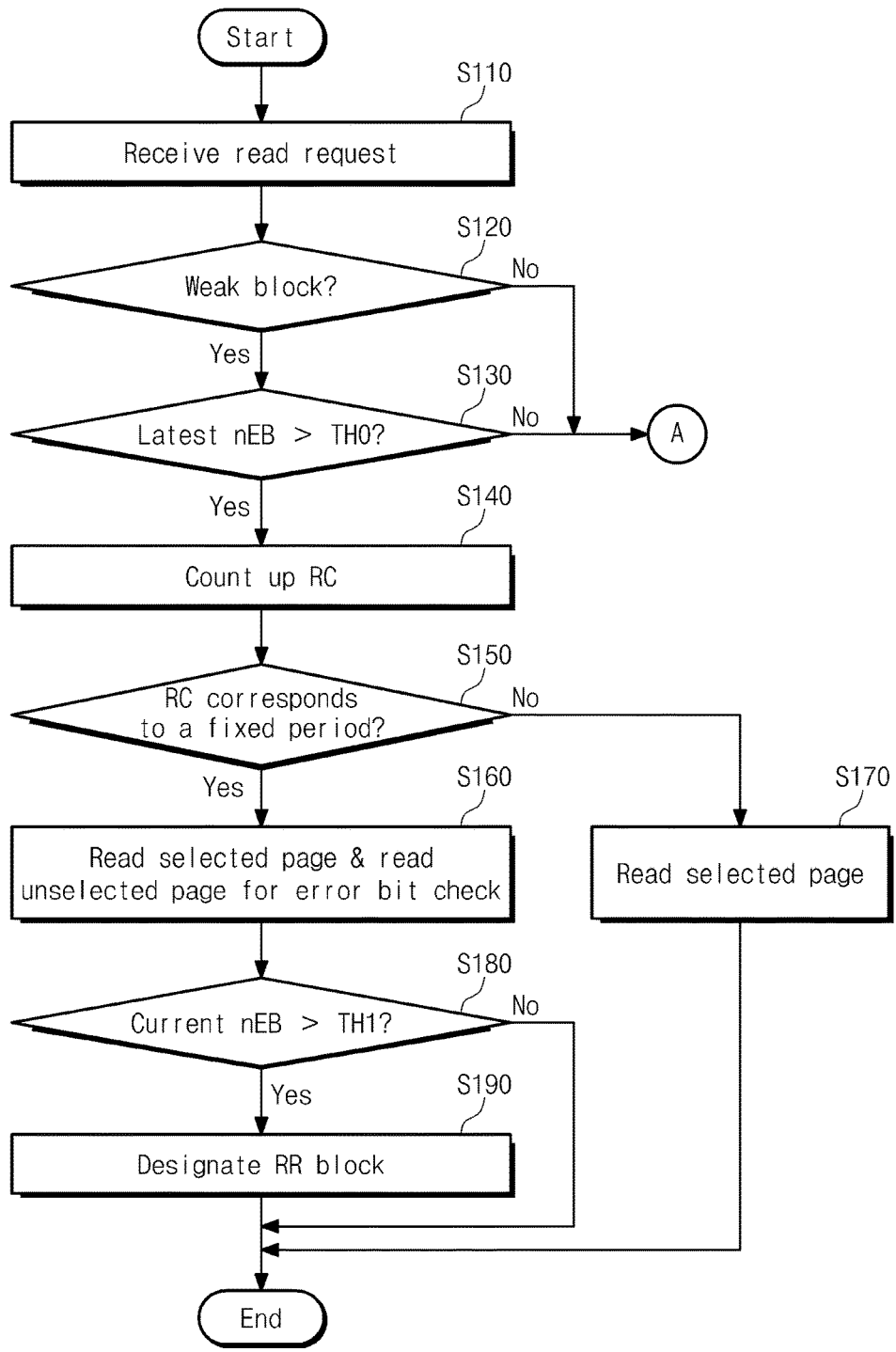

STORAGE DEVICE AND READ RECLAIM METHOD THEREOF

CROSS-REFERENCE TO RELATED APPLICATIONS

A claim for priority under 35 U.S.C. § 119 is made to Korean Patent Application No. 10-2015-0181872 filed Dec. 18, 2015, in the Korean Intellectual Property Office, the entire contents of which are hereby incorporated by reference.

BACKGROUND

Embodiments of the disclosure relate to a semiconductor memory device, and in particular, to a storage device and a read reclaim method thereof.

A flash memory device is being used as voice and image data storage media of information devices such as a computer, a smart phone, a personal digital assistant (PDA), a digital camera, a voice recorder, an MP3 player, a handheld PC, and the like. However, since an erase operation is performed before writing data at a flash memory, a unit of data to be written may be greater than a unit of data to be erased. This makes it difficult to utilize a file system for a typical hard disk even in the case where a flash memory is used as an auxiliary storage device.

An operating mode called "read reclaim" is being used in various storage devices including flash memory devices. When a read operation is repeated with respect to any one memory block, error bits increase, for example, due to read disturbance. The read reclaim refers to an operation to copy data stored in a memory block into a different memory block before an uncorrectable error occurs at the data stored in the memory. The disclosure provides a read reclaim technique capable of performing efficient management and wear leveling with respect to a nonvolatile memory device.

SUMMARY

Embodiments of the disclosure provide a read reclaim method which may reduce the likelihood of a read fail and a storage device including the same.

One aspect of embodiments of the disclosure is directed to provide a read reclaim method of a storage device. The method may include detecting, at a cycle of a random number of read operations, the number of error bits within non-selection data stored in each of a plurality of memory blocks. A memory block having the number of detected error bits, with respect to the number of read operations, increasing at a rate greater than a reference rate over one or more cycles of the random number of read operations is selected as a weak block. The number of error bits within non-selection data stored in the weak block is detected at a cycle of a fixed number of read operations. A detection is made of whether the number of error bits detected according to the fixed-number cycle is greater than or equal to a read reclaim reference. The non-selection data is data not requested by a host.

Another aspect of embodiments of the disclosure is directed to provide a read reclaim method of a storage device. The method may include detecting, after a first number of read operations, the number of error bits of data stored in each of a plurality of memory blocks. The number of error bits of data stored in each of the memory blocks is detected after a second number of read operations. The rate of increase of the number of detected error bits occurring between the first and second numbers of read operations is calculated for each of the memory blocks. The memory blocks are classified into two groups based on the calculation results. A first memory block of a first of the two groups is designated as a read reclaim block based upon a first reference value, and a second memory block of a second of the two groups is designated as a read reclaim block based upon a second reference value that differs from the first reference value.

Still another aspect of embodiments of the disclosure is directed to provide a storage device including a nonvolatile memory device, having a plurality of memory blocks, and a memory controller. The memory controller detects the rate of increase of the number of error bits of data stored in each of the plurality of memory blocks with respect to the number of read operations requested for the memory block. The memory controller assigns, for each of the memory blocks, based on the detected rate of increase for the memory block: (1) a reference value for designating the memory blocks as a read reclaim block, or (2) the number of read operations occurring in a cycle before a detection is made of the number of error bits existing in the memory block.

Still another aspect of embodiments of the disclosure is directed to provide a read-reclaim method of a nonvolatile memory device. The method includes: a) receiving a previous request for a read operation of a location of a memory block of the nonvolatile memory device identified by the previous request; b) determining, in response to the previous request and through a read operation of the memory block, the number of error bits stored by a location of the memory block that is not identified by the previous request; c) receiving a current request for a read operation of a location of the memory block identified by the current request; d) determining, in response to the current request and through a read operation of the memory block, the number of error bits stored by a location of the memory block that is not identified by the current request; e) determining the rate of increase between the determined numbers of error bits with respect to the number of read operation requests received between the previous and current requests; f) designating the memory block as a weak block when the rate of increase exceeds a reference rate and otherwise designating the memory block as a normal block; g) repeating each of operations (c) and (d) multiple times; and h) designating the weak block as being available for a read-reclaim operation when the number of error bits determined in a repetition of operation (d) exceeds a read-reclaim threshold or the total number of read operation requests for the memory block exceeds a threshold number.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 5 is a diagram illustrating a per-block error bit table according to an embodiment of the disclosure;

FIGS. 8A and 8B are flow charts illustrating a detailed example of a read reclaim method according to the disclosure;

DETAILED DESCRIPTION

Figure 1:
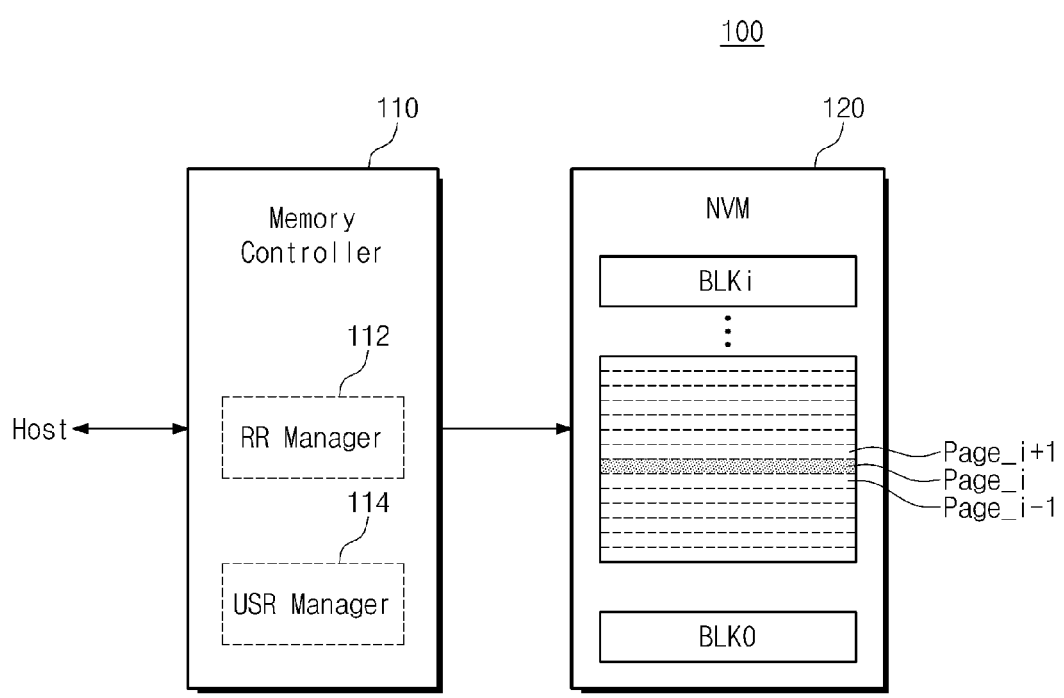
FIG. 1 is a block diagram illustrating a storage device according to an embodiment of the disclosure.

It may be understood that both the foregoing general description and the following detailed description are provided as examples, for illustration and not for limiting the scope of the disclosure. Reference will now be made in detail to the present preferred embodiments of the disclosure, examples of which are illustrated in the accompanying drawings. Wherever possible, the same reference numbers are used in the drawings and the description to refer to the same or like parts.

Below, a storage device using a flash memory device will be exemplified to describe features and functions of the disclosure. However, other features and functions may be easily understood from information disclosed herein. The disclosure may be implemented or applied through other embodiments. In addition, the detailed description may be changed or modified according to view points and applications without departing from the claims, the scope and spirit, and any other purposes of the disclosure.

FIG. 1 is a block diagram illustrating a storage device according to an embodiment of the disclosure. Referring to FIG. 1, a storage device 100 may include a memory controller 110 and a nonvolatile memory device 120. In an embodiment, each of the memory controller 110 and the nonvolatile memory device 120 may be implemented with one chip, one package, or one module. Alternatively, the memory controller 110 and the nonvolatile memory device 120 may be implemented with one chip, one package, or one module so as to constitute a memory system such as a memory card, a memory stick, or a solid state drive (SSD).

The controller 110 may be configured to control the nonvolatile memory device 120. For example, the memory controller 110 may store or read data in or from the nonvolatile memory module 120 in response to an external request. The memory controller 110 may provide the nonvolatile memory device 120 with a command, an address, and a control signal to access the nonvolatile memory device 120.

The memory controller 110 may include a read-reclaim (RR) manager (hereinafter referred to as "RR manager") 112. The RR manager 112 may manage and retain the following using a table: a read count, the number of error bits, and an error bit increase rate (EBIR) for each of a plurality of memory blocks. The above-described values stored in the table may be updated at a point in time when a read operation occurs and may be stored in the nonvolatile memory device 120. The RR manager 112 may classify memory blocks into at least two groups based on the error bit increase rate EBIR of each memory block. For example, the RR manager 112 may classify memory blocks, each of which has the error bit increase rate EBIR greater than a reference, as weak blocks. The RR manager 112 may classify memory blocks, each of which has the error bit increase rate EBIR smaller than or equal to the reference, as normal blocks or strong blocks.

When the number of error bits for a weak block reaches the reference, the RR manager 112 may designate a corresponding memory block as a read reclaim block. Error bits of a weak block may be detected randomly or periodically. According to an error bit detecting manner of the disclosure, a weak block may be designated as a read reclaim target before an uncorrectable error occurs.

The memory controller 110 may further include a non-selection read manager (hereinafter referred to as "USR manager") 114. The USR manager 114 may monitor the number of error bits for each of memory blocks BLK0 to BLKi in the nonvolatile memory device 120. That is, when a read operation of a selected page of a memory block is requested from a host, the USR manager 114 may perform a read operation for an unselected page adjacent to the selected page as a background operation or at the same time with the selected page. This read operation may be referred to as an "unselected read operation." The read operation of an unselected page may be performed at a random read count (RC). An embodiment of the disclosure will be exemplified in which a random read operation is performed at a random read count. However, the scope and spirit of the disclosure may not be limited thereto. For example, the random read operation may be performed for every specific read count period. That is, when the number of error bits of a weak block exceeds a reference, the non-selection read operation which is normally performed at a random read count may be performed periodically.

The number of error bits counted by the USR manager 114 may be used as information for calculating the increasing rate of the number of error bits of a memory block with respect to a read count. That is, the number of counted error bits may refer to information which is used for the RR manager 112 to select a weak block. A weak block may be designated as a read reclaim block based on a result of a non-selection read operation, which is periodically performed with respect to the weak block. The RR manager 112 or the USR manager 114 may be implemented inside the memory controller 110 in the form of a hardware component or software component.

Under control of the control circuit 110, the nonvolatile memory device 120 may store data received from the memory controller 110 or may transmit data stored therein to the memory controller 110. The nonvolatile memory device 120 may include a plurality of memory blocks BLK0 to BLKi. In particular, one memory block may include a plurality of pages. In the case where one page is iteratively read, a non-selection read voltage Vread may be applied to word lines corresponding to remaining pages of the same block other than the iteratively read page, respectively. The non-selection read voltage Vread may be a voltage sufficient enough to turn on unselected memory cells, and a level thereof may be higher than that of a read voltage. For this reason, when the non-selection read voltage Vread is iteratively applied to unselected memory cells, the interference may have an influence on the amount of charges of a memory cell(s). This may be referred to as "read disturbance." For example, in the case where a page Page_i is iteratively read, surrounding pages Page_i−1 to Page_i+1 or remaining pages in the same block may be influenced by the read disturbance.

The random read operation of unselected pages which is performed by the USR manager 114 at a random read count may make it possible to reduce the influence of the read disturbance. In addition, the USR manager 114 may monitor a change in the number of error bits of respective unselected pages. The number of error bits for each unselected page may be used as information for calculating the error bit increase rate EBIR of a memory block. The memory controller according to an embodiment of the disclosure may control the nonvolatile memory device 120 so as to perform the read reclaim operation. The read reclaim operation may refer to an operation to move a memory block, which includes memory cells where data read from the nonvolatile memory device 120 is stored, or an operation to move a part of data in the memory block to another memory block when the number of error bits of the read data is greater than or equal to a reference. That is, the error correction operation may refer to an operation to move data to another memory block to maintain the reliability of data including a plurality of error bits or data with the probability that the number of error bits exceeds an error correction capacity of an error correction block 117 (refer to FIG. 2). When data is read from the nonvolatile memory device 120, the memory controller 110 may detect and correct an error through the error correction block 117 and may transmit the error-corrected data to a host (not shown) or the nonvolatile memory device 120. As described above, when the number of error bits of data read from the nonvolatile memory device 120 is greater than or equal to a reference, the memory controller 110 may control the nonvolatile memory device 120 so as to perform the read reclaim operation.

The memory controller 110 according to an embodiment of the disclosure may change an error bit detection period of a memory block based on the error bit increase rate EBIR of the memory block. For example, the number of error bits may be detected with respect to a weak block, of which an error bit increase rate is greater than a reference increasing rate, at a fixed detection period, not a random read count. In an embodiment, error bits of unselected pages may be checked at an error bit detection period which is shorter than an average read period existing at a previous random read operation. With the above description, a weak block may be designated as a read reclaim block before an uncorrectable error occurs in the data stored therein.

According to an embodiment of the disclosure, the storage device 100 may determine a read reclaim block based on an error characteristic of a memory block. That is, a memory block with a great error bit increase rate may be designated as a read reclaim block before the occurrence of the uncorrectable error by setting an error detection period to a fixed value, not a random value. Accordingly, the data integrity and operation performance of the storage device 100 may be enhanced by applying the above-described read reclaim method to the storage device 100.

Figure 2:
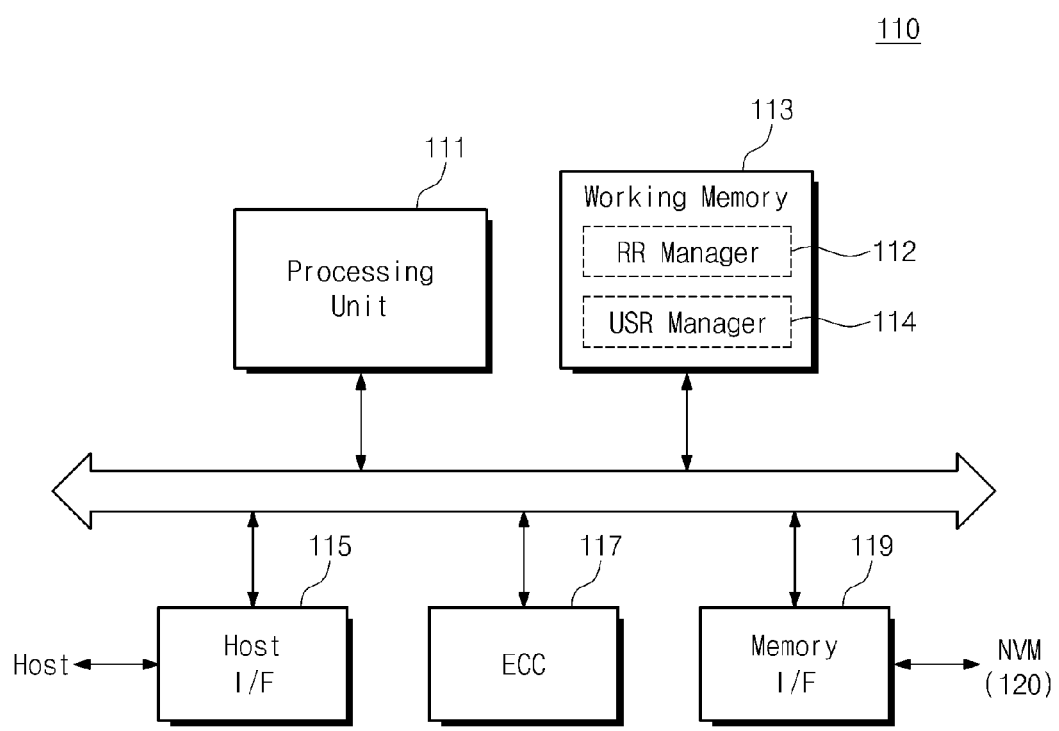
FIG. 2 is a block diagram illustrating a configuration of a memory controller illustrated in FIG. 1, according to an embodiment of the disclosure.

FIG. 2 is a block diagram illustrating a configuration of a memory controller illustrated in FIG. 1, according to an embodiment of the disclosure. Referring to FIG. 2, the memory controller 110 may include processing unit 111, a working memory 113, a host interface 115, the error correction block 117, and a memory interface 119. However, it should be appreciated that components of the memory controller 110 are not limited to components illustrated in FIG. 2. For example, the memory controller 110 may further include a read only memory (ROM) which stores code data needed for an initial booting operation.

The processing unit 111 may include a central processing unit or a microprocessor. The processing unit 111 may manage an overall operation of the memory controller 110. The processor 111 may drive firmware for driving the memory controller 110. The firmware may be loaded on the working memory 113 and may be driven in response to a call of the processing unit 111.

The working memory 113 may be used to load software (or firmware) for controlling the memory controller 110 or data. The stored software and data may be driven or processed by the processing unit 111. The working memory 113 may include at least one of a cache memory device, a dynamic random access memory (DRAM) device, a phase-change RAM (PRAM) device, or a flash memory device. According to an embodiment of the disclosure, the working memory 113 may include the RR manager 112 and the USR manager 114. Although not shown, it should be appreciated that a flash translation layer (FTL) and the like are loaded on the working memory 113.

The host interface 115 may provide an interface between the host and the memory controller 110. The host and the memory controller 110 may be connected through at least one of various standardized interfaces. The standardized interfaces may include an advanced technology attachment (ATA) interface, a serial ATA (SATA) interface, an external SATA (e-SATA) interface, a small computer small interface (SCSI), a serial attached SCSI (SAS), a peripheral component interconnection (PCI) interface, a PCI Express (PCI-E) interface, a universal serial bus (USB) interface, an IEEE 1394 interface, a universal flash store (UFS) interface, a card interface, and the like.

The error correction block 117 may correct an error of data generated due to various causes. For example, the error correction block 117 may be configured to detect and correct an error of data read from the nonvolatile memory device 120. In particular, the error correction block 117 may detect the number of error bits of the read data in response to a request of the USR manager 114. The detected number of error bits nEB may be provided to the RR manager 112. The RR manager 112 may calculate the error bit increase rate EBIR of a selected memory block based on the number of error bits nEB of the selected memory block. For example, the RR manager 112 may determine whether the selected memory block is a weak block, based on the error bit increase rate EBIR. The USR manager 114 may set an error bit detection period of the memory block, determined as the weak block, to a fixed value for management. Alternatively, the USR manager 112 may manage the number of error bits or a read count, which is used to designate a weak block as a read reclaim block, to be different from that of a normal memory block.

The memory interface 119 may provide an interface between the memory controller 110 and the nonvolatile memory device 120. For example, data processed by the processing unit 111 may be stored in the nonvolatile memory device 120 through the memory interface 119. For another example, data stored in the nonvolatile memory device 120 may be provided to the processing unit 111 through the memory interface 119.

Components of the memory controller 110 are exemplified. The memory controller 110 according to an embodiment of the disclosure may change a read reclaim reference for selecting a memory block as a read reclaim block, based on an error characteristic of the memory block. This may mean that an error bit detection period, the number of error bits, and a read count for designating a memory block as a read reclaim block are changed.

Figure 3:
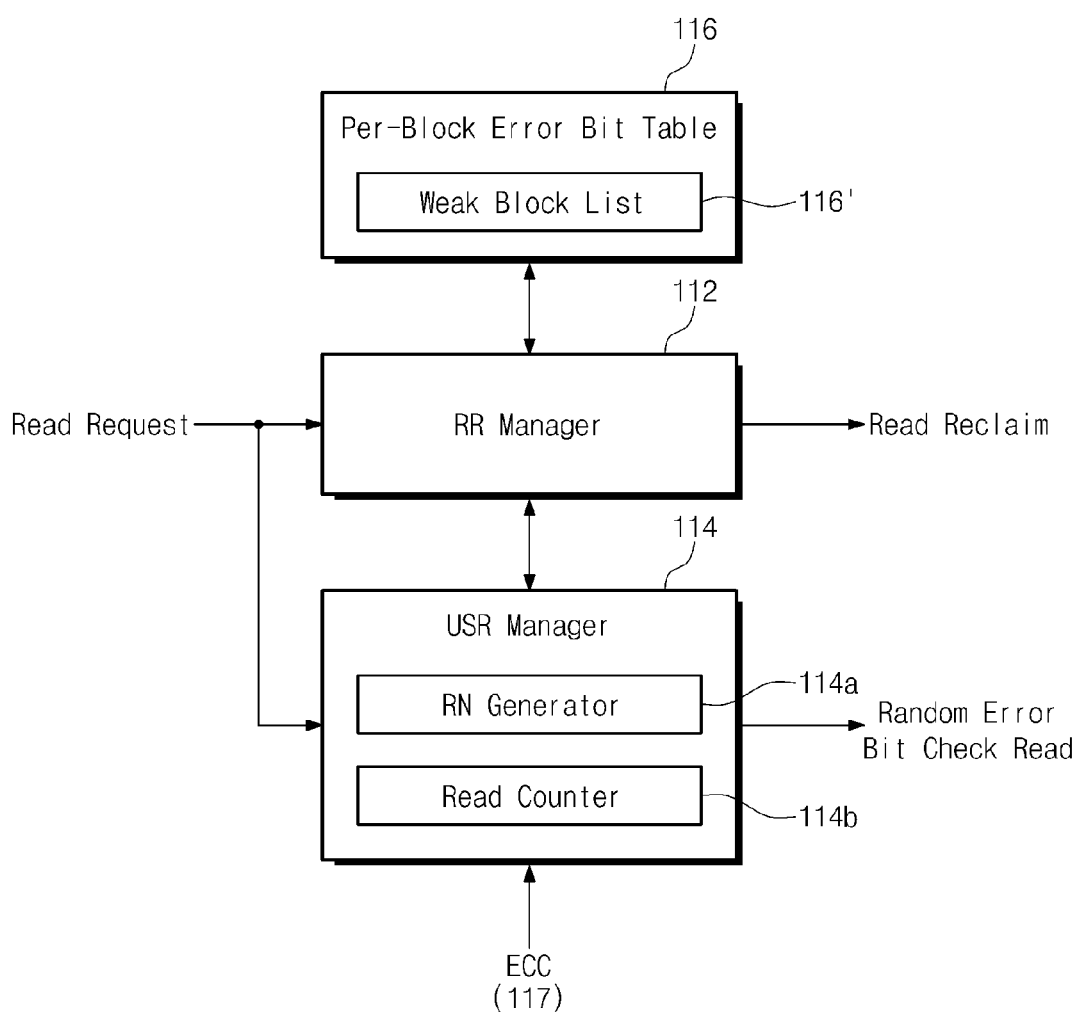
FIG. 3 is a block diagram illustrating a function of a memory controller according to an embodiment of the disclosure.

FIG. 3 is a block diagram illustrating a function of a memory controller according to an embodiment of the disclosure. Referring to FIG. 3, the memory controller 110 may include the read reclaim (RR) manager 112, the non-selection read (USR) manager 114, and a per-block error bit table 116. Here, the per-block error bit table 116 may be implemented on the working memory 113 and may be stored in the nonvolatile memory device 120 periodically or whenever a read count RC increases. Here, the RR manager 112 may be implemented with a part of the flash translation layer (FTL) or with a part of a code which is driven when a read fail occurs.

The RR manager 112 may receive a read request from the host. The RR manager 112 may determine a read reclaim block with reference to a weak block list 116', which is stored in the per-block error bit table 116, and an error bit detection result of the USR manager 114. In particular, the RR manager 112 may determine weak blocks as read reclaim blocks using a reference different from normal blocks.

The USR manager 114 may perform a non-selection read operation of a selected memory block. To this end, the USR manager 114 may include a random number generator 114a and a read counter 114b. When a read request occurs, the USR manager 114 may increase the read count RC of a selected memory block. If the increased read count RC is the same as a number generated by the random number genera-tor 114a, the non-selection read operation may be performed with respect to unselected pages of a selected memory block selected. The number of error bits counted for the non-selection read operation may be updated in the per-block error bit table 116.

The RR manager 112 may store, in the per-block error bit table 116, the number of error bits corresponding to the read count RC for the non-selection read operation occurring with respect to each memory block.

The RR manager 112 may determine whether a memory block is a weak block WB, with reference to a read count RC and the number of error bits nEB of each memory block stored in the per-block error bit table 116. That is, when an error bit increase rate increasing according to a read count is greater than a reference increasing rate, the RR manager 112 may classify a memory block, of which the reliability is relatively low, as a weak block. When the error bit increase rate according to a read count is smaller than or equal to the reference increasing rate, the RR manager 112 may classify a memory block, of which the reliability is relatively high, as a normal block.

Once a memory block is classified as a weak block, the RR manager 112 may register the memory block at the weak block list 116'. The USR manager 114 may perform a non-selection read operation of a weak block at a constant period regardless of a random number. In an embodiment, a period of a fixed non-selection read operation may be reduced to be shorter than a period of a random non-selection read operation. The RR manager 112 may detect a change in the number of error bits of a weak block at a reduced, fixed period. If the number of error bits detected from a weak block reaches a value for designating the weak block as a read reclaim block, the RR manager 112 may designate the weak block as a read reclaim block. In an embodiment, the number of error bits used to designate a weak block as a read reclaim block may be equally applied to both a weak block and a normal block.

In another embodiment, the RR manager 112 may apply different references, for designating a block as a read reclaim block, to a normal block and a weak block. That is, a reference for the number of error bits for read reclaim of a weak block may be set to be lower than a reference for the number of error bits for read reclaim of a normal block. In this case, a period for detecting the number of error bits may not be fixed.

In still another embodiment, the RR manager 112 may apply different references (e.g., different read counts) for designating a block as a read reclaim block as a normal block and a weak block. That is, a reference of the read count for read reclaim of a weak block may be set to be lower than a reference of the read count for read reclaim of a normal block. In this case, a period for detecting the number of error bits may not be fixed.

In still another embodiment, the RR manager 112 may apply both an error bit reference and a read count reference, which are used to designate a block as a read reclaim block, to a normal block and a weak block. If any one of the error bit reference and the read count reference for a weak block is satisfied, a corresponding weak block may be designated as a read reclaim block.

Functions of the RR manager, the USR manager 114, and the per-block error bit tale 116 are described above. The above-described components of the storage device 100 may allow a read reclaim operation to be efficiently performed according to a characteristic of a memory block.

Figure 4:
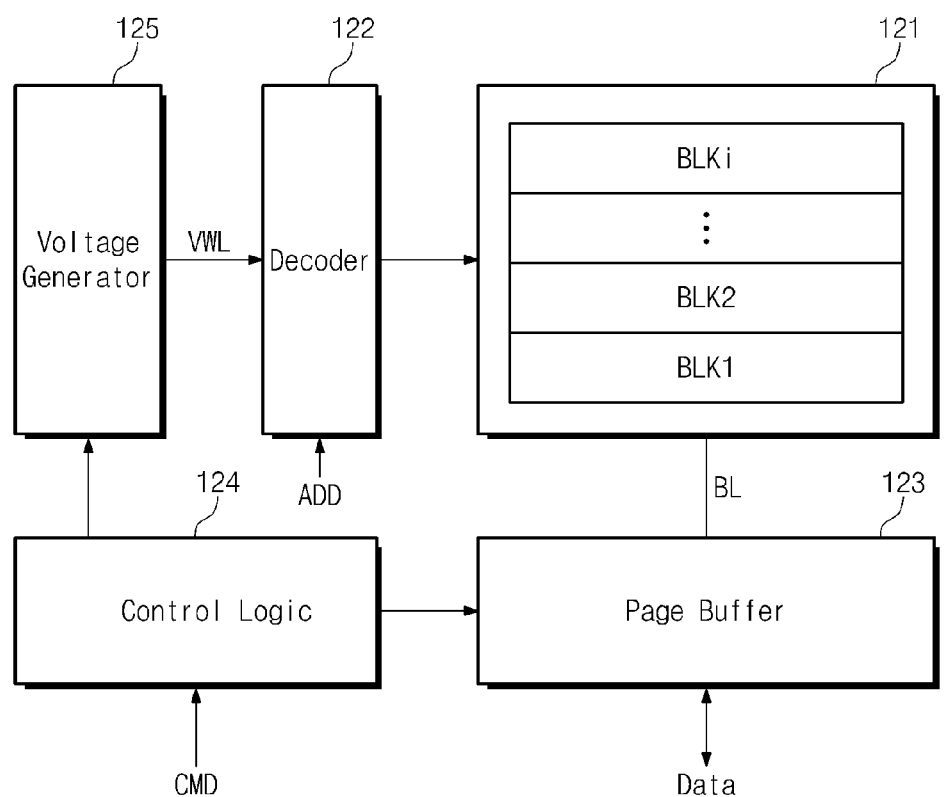
FIG. 4 is a block diagram illustrating a nonvolatile memory device according to an embodiment of the disclosure.

FIG. 4 is a block diagram illustrating a nonvolatile memory device according to an embodiment of the disclosure. Referring to FIG. 4, a nonvolatile memory device 120 may include a memory cell array 121, a decoder 122, a page buffer 123, control logic 124, and a voltage generator 125.

The memory cell array 121 may be connected to the decoder 122 through word lines and selection lines. The memory cell array 121 may be connected to the page buffer 123 through bit lines BL. The memory cell array 121 may include a plurality of memory cells BLK1 to BLKi. Each memory block may include a plurality of NAND cell strings. Data may be written in the memory cell array 121 by the page. An erase operation may be performed by the memory block. Error bit characteristics of the memory blocks BLK1 to BLKi may be different from each other due to various causes. That is, even though the same data is written at each memory block under the same bias condition, the number of error bits nEB of read data may be variable.

In an embodiment of the disclosure, the memory cell array 121 may be implemented with a three dimensional (3D) memory. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The decoder 122 may select one of the memory blocks BLK1 to BLKi of the memory cell array 121 in response to an address ADD. The decoder 122 may provide a word line voltage VWL corresponding to an operating mode to a word line of a selected memory block. During a program operation, for example, the decoder 122 may transfer a program voltage and a verification voltage to a selected word line and a pass voltage to an unselected word line. The decoder 122 may select a memory block by providing a selection signal to selection lines SSL and GSL. During a read operation, a read voltage may be applied to a selected word line of a memory block. During a read operation, a pass read voltage may be applied to unselected word lines of a memory block, respectively.

The page buffer 123 may operate as a write driver or a sense amplifier based on a mode of operation. During a program operation, the page buffer 123 may transfer a bit line voltage corresponding to to-be-programmed data, Data, to a bit line of the memory cell array 121. During a read operation, the page buffer 123 may sense data stored in a selected memory cell through a bit line. The page buffer 123 may latch the sensed data and may output the latched data, Data, to an external device.

The control logic 124 may control the decoder 122 and the page buffer 123 in response to a command CMD from the external device.

The voltage generator 125 may generate various word line voltages to be supplied to word lines and a voltage which is supplied to a bulk (e.g., a well area) where memory cells are formed, under control of the control logic 124. The word line voltages to be supplied to word lines may include a program voltage (e.g., Vpgm_i), a pass voltage (e.g., Vpass), a read voltage (e.g., Vrd_i), a pass read voltage (e.g., Vread_i), and the like. The voltage generator 125 may further generate selection line voltages (e.g., VSSL and VGSL) to be provided to the selection lines SSL and GSL during a read operation or a program operation.

FIG. 5 is a diagram illustrating a per-block error bit table according to an embodiment of the disclosure. Referring to FIG. 5, the per-block error bit table 116 may include read count RC, the number of error bits nEB, error bit increase rate EBIR, and block classification items about each memory block.

The read count RC may indicate a read frequency for each of the memory blocks BLK0 to BLKi. Here, the read count may include both the number of read operations requested by a host and the number of non-selection read operations. The read count RC may be increased when a read operation is requested from the host or when a non-selection read operation is performed.

The number of error bits nEB may indicate the number of error bits detected for a corresponding memory block by the host or through the non-selection read operation. For example, the number of error bits nEB may indicate the number of error bits generated for any one page. In the case of the non-selection read operation, the number of error bits which are generated due to the read disturbance at an unselected page may refer to the number of error bits nEB. In an embodiment, the number of error bits nEB detected at a read count of (N−2) of the memory block BLK1 may correspond to "2". In contrast, like the memory block BLK0, no error bit may be detected at a read count of 3N.

The error bit increase rate EBIR may be calculated based on the read count RC and the number of error bits nEB. That is, the error bit increase rate EBIR may indicate the number of error bits increased for a specific read count. For example, the error bit increase rate EBIR of each memory block may be obtained by calculating a change in the number of error bits detected in an increasing section of an N-th read count from a non-selection read operation performed for the first time. The error bit increase rate EBIR may be calculated based on a change in the number of error bits for a specific read count section. Alternatively, an increase in error bits according to an increase in a read count may be calculated by various statistical methods.

The block classification may indicate whether a corresponding block is determined, according to the error bit increase rate EBIR, to be a weak block. It may be assumed that the error bit increase rate EBIR is detected N times after the read count RC is increased. Under this assumption, the memory block BLK2 may be classified as a weak block WB. The reason is that an error bit increase rate α of the memory block BLK2 is greater than a reference increase rate R. Since error bit increase rates β, γ, δ, and ε of memory blocks BLK0, BLK3, BLK4, and BLKm are less than the reference increase rate R, the memory blocks BLK0, BLK3, BLK4, and BLKm may be classified as a normal block NB. However, since a read count of the memory block BLK1 does not reach a read count N for determining the error bit increase rate EBIR, the memory block BLK1 may remain a no decision state. Here, it should be appreciated that memory blocks are classified into various groups.

Figure 6:
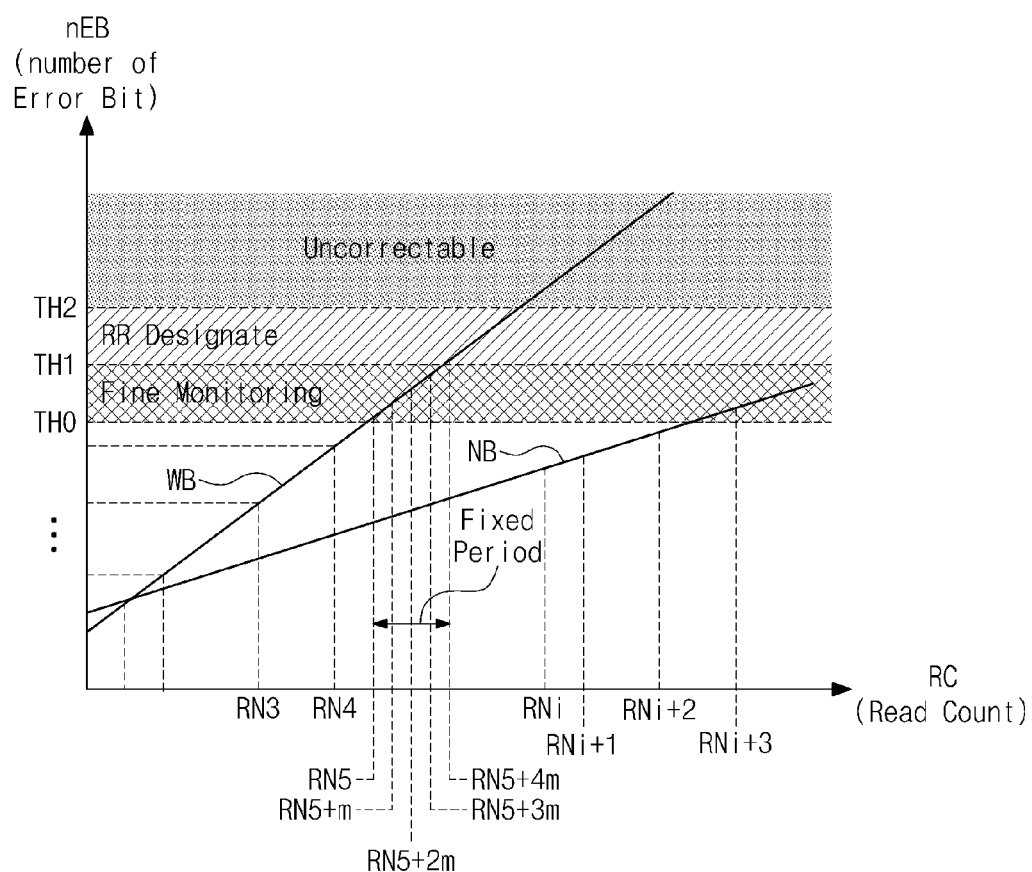
FIG. 6 is a graph illustrating a read reclaim method for a weak block, according to an embodiment of the disclosure.

FIG. 6 is a graph illustrating a read reclaim method for a weak block, according to an embodiment of the disclosure. Referring to FIG. 6, straight lines each indicating the number of error bits nEB of a read count RC are illustrated with respect to a weak block WB and a normal block NB. An error bit increase rate of the weak block WB may be greater than that of the normal block NB. That is, a slope of the straight line indicating the weak block WB may be greater than a slope of the straight line indicating the normal block NB.

First of all, when data is written at a selected memory block, the per-block error bit table 116 for managing a read count RC and the number of error bits nEB of the selected memory block may be created. Second of all, when a read count RC for detecting an error bit increase rate is satisfied, the error bit increase rate EBIR may be calculated. Whether a memory block is a weak block WB may be determined according to the error bit increase rate EBIR.

In the graph, a non-selection read operation may be performed every fixed period m from a point in time when the number of error bits nEB is greater than or equal to a threshold value TH0, with respect to a memory block determined to be the weak block WB. That is, in the case of the memory block determined to be the weak block WB, the number of error bits nEB may be detected whenever a read count is increased by m. In the weak block WB, a non-selection read operation may be performed according to a random read count at a point in time when the number of error bits nEB is smaller than the threshold value TH0. However, if the number of error bits nEB of the weak block reaches and exceeds the threshold value TH0, a non-selection read operation may be performed every fixed period m to detect the number of error bits. In an embodiment, the fixed period m may be set to a value smaller than an average period of a random read count. This section in which error bits are monitored every fixed period may be referred to as a "fine monitoring section."

If the number of error bits of the weak block WB is detected with the fixed period (e.g., m times), the weak block WB may be designated as a read reclaim block at an appropriate time. In the case where the number of error bits of the weak block WB is detected at a random read count, in the worst case, the weak block WB may be designated as a block with an uncorrectable error, not a read reclaim block. However, if the number of error bits of the weak block WB is detected with the fixed period (m times), the weak block WB may be designated as a read reclaim block at a read count of (RN5+4 m) where the number of error bits nEB is greater than a threshold value TH1.

Figure 7:
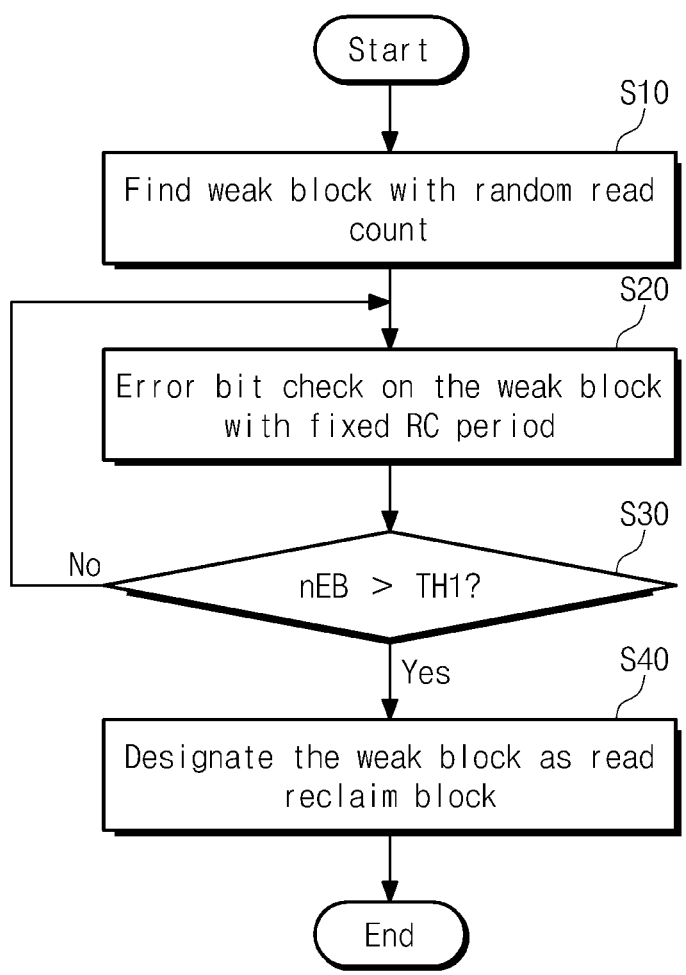
FIG. 7 is a flow chart illustrating a read reclaim method illustrated in FIG. 6, according to an embodiment of the disclosure.

FIG. 7 is a flow chart illustrating a read reclaim method illustrated in FIG. 6, according to an embodiment of the disclosure. Referring to FIG. 7, a read reclaim method according to an embodiment of the disclosure may be characterized in that a weak block is detected and the number of error bits of the detected weak block is detected with a fixed detection period.

In step S10, a weak block WB may be detected. A read count RC for each of memory blocks where a read operation of written data is requested and the number of error bits nEB detected at a random read count may be stored in the per-block error bit table 116. A memory block of which the number of error bits is greater than a reference increasing rate may be designated as a weak block WB based on the stored read count RC and the number of error bits nEB. Here, an average value of error bit increase rates of all memory blocks managed in the per-block error bit table 116 may be used as the reference increasing rate of the error bit increase rate EBIR for selecting the weak block WB. Alternatively, a fixed error bit increase rate obtained through experimentation may be used as the reference increasing rate of the error bit increase rate EBIR for selecting the weak block WB.

In step S20, the number of error bits nEB of the detected weak block WB may be detected with a fixed period. For example, it may be assumed that a non-selection read operation for detecting the number of error bits at a random read count RC is performed before a memory block is determined as a weak block WB. However, with regard to a memory block determined as a weak block WB, a non-selection read operation for detecting the number of error bits may be performed once whenever a read count is increased two times. However, a threshold value TH1 of the number of error bits for determining a read reclaim block may be equally applied to a weak block WB and a normal block NB.

In step S30, there may be determined whether the number of error bits detected from the weak block WB with a fixed period reaches the threshold value TH1 of the number of error bits nEB for designating a block as a read reclaim block. If the number of error bits nEB detected is not greater than the threshold value TH1 (No), the procedure may return to step S20 to continue to detect the number of error bits with a fixed period. If the number of error bits nEB detected is greater than the threshold value TH1 (Yes), the procedure may proceed to step S40 in which a corresponding weak block WB is designated as a read reclaim block.

In step S40, a weak block WB in which the number of error bits is detected with the fixed period may be designated as a read reclaim block. Although not described, data stored in the weak block WB designated as a read reclaim block may be copied to another normal memory block, and the weak block WB may be erased.

Above, there is described a read reclaim method in which a read reclaim block is determined based on the number of error bits detected with a fixed period with respect to a detected weak block WB. As a weak block WB is detected and the number of error bits nEB is detected with a fixed period, a weak block of which the error bit increase rate EBIR is relatively great may be accurately designated as a read reclaim block. That is, the situation that an uncorrectable error occurs at a weak block of which the error bit increase rate EBIR is relatively great may be prevented.

Figure 8B:
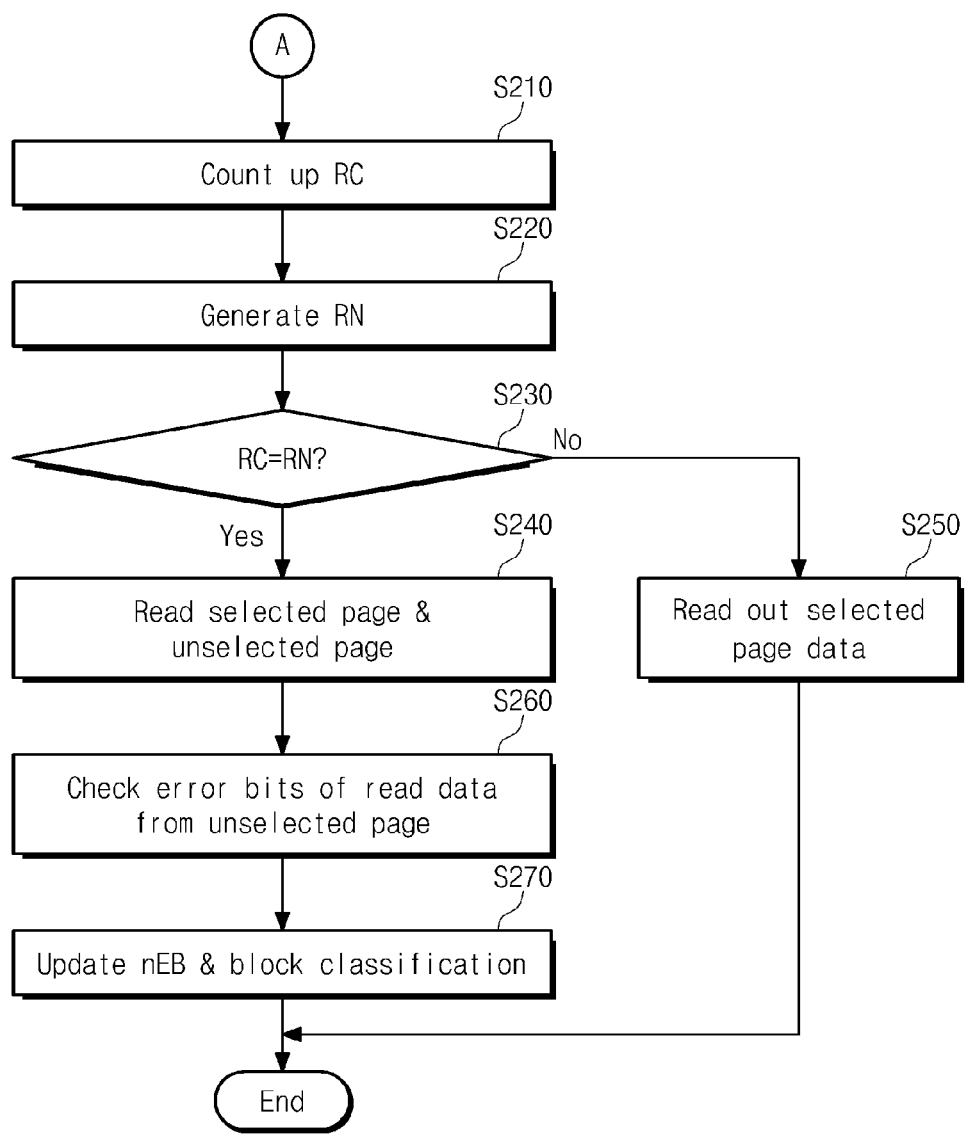

FIGS. 8A and 8B are flow charts illustrating a detailed example of a read reclaim method according to the disclosure. The procedure for performing a non-selection read operation in which error bits of a weak block WB are detected with a fixed period will be described with reference to FIG. 8A. A method in which a non-selection read operation is performed at a random read count RC will be described with reference to FIG. 8B.

Referring to FIG. 8A, if the number of error bits nEB of a weak block WB exceeds a threshold value TH0, there may be performed a non-selection read operation in which the number of error bits is detected with a fixed period. This will be described in more detail below.

In step S110, the memory controller 110 may receive a read request from a host. The read reclaim manager 112 of the memory controller 110 may create, maintain, and update the per-block error bit table 116 for managing a read count RC and the number of error bits nEB for each of the memory blocks where data is written.

In step S120, the memory controller 110 may determine whether a read-requested memory block is a weak block WB. The memory controller 110 may determine whether the read-requested memory block is included in a weak block list 116', based on the per-block error bit table 116. If the selected memory block is not a weak block WB (No), the procedure may proceed to "A". A non-selection read operation corresponding to "A" will be described with reference to FIG. 8B. If the selected memory block is a weak block WB (Yes), the procedure may proceed to step S130.

In step S130, the memory controller 110 may check the number of error bits nEB most recently counted with respect to the selected weak block WB. If the number of error bits most recently counted is greater than a threshold value TH0, the procedure may proceed to step S140. If the number of error bits most recently counted is not greater than the threshold value TH0, the procedure may proceed to "A".

In step S140, a read count RC for a memory block where a read request occurs may be increased, and the per-block error bit table 116 may be updated with the increased read count. A value of the per-block error bit table 116 may be stored in a specific area of the nonvolatile memory device 120 periodically or if necessary. Accordingly, even though power is removed, it may be possible to maintain information of a read count RC and the number of error bits nEB of each of the memory blocks where data is written.

In step S150, the memory controller 110 may determine whether the updated read count RC is the same as a fixed period m. If the updated read count RC is not the same as the fixed period m (No), the procedure may proceed to step S170 for reading a selected page without a non-selection read operation. If the updated read count RC is the same as the fixed period m (Yes), the procedure may proceed to step S160 for reading an unselected page together with the selected page.

In step S160, the memory controller 110 may read data of a host-requested page from a selected memory block and may output the read data. In addition, the memory controller 110 may read data of an unselected page, which is not requested by the host, from the selected memory block of the nonvolatile memory device 120 and may detect error bits of the read data.

In step S170, the memory controller 110 may read data of only a host-requested page from the selected memory block of the nonvolatile memory device 120 and may output the read data to the host.

In step S180, the memory controller 110 may determine whether the number of error bits nEB read in step S160 from the unselected page is greater than a threshold value TH1. If the number of error bits currently detected is greater than the threshold value TH1, the procedure may proceed to step S190. If the number of error bits currently detected is not greater than the threshold value TH1, the procedure may end.

In step S190, the memory controller 110 may perform a read reclaim procedure for a weak block WB in which the number of error bits nEB detected becomes greater than the threshold value TH1. The threshold value TH1 may correspond to a reference of the number of error bits for designating a block as a read reclaim block. If a block is designated by the memory controller 110 as a read reclaim block, the data copy and erase procedure may be performed under control of the read reclaim manager 112.

A read reclaim method performed at the memory controller according to an embodiment of the disclosure is described above.

FIG. 8B is a flow chart illustrating the procedure of "A" illustrated in FIG. 8A. Referring to FIG. 8B, there will be described the procedure associated with the following: the case that a read-requested memory block is not a weak block and the case that even though the read-read-requested block is a weak block, the number of error bits most recently detected is not greater than a threshold value TH0.

In step S210, a read count RC for a selected memory block may be increased. The read count RC may be maintained and managed in the above-described per-block error bit table 116.

In step S220, the memory controller 110 may generate a random number (RN). However, it should be appreciated that the random number RN is one among a plurality of values previously generated.

In step S230, the increased read count RC may be compared with the random number RN. If the read count RC is the same as the random number RN (Yes), the procedure may proceed to step S240. If the read count RC is not the same as the random number RN (No), the procedure may proceed to step S250.

In step S240, the memory controller 110 may perform a non-selection read operation of an unselected page as well as the selected page.

In step S250, the memory controller 110 may read only the selected page from the selected memory block.

In step S260, the memory controller 110 may detect an error of the read page through a non-selection read operation.

In step S270, the memory controller 110 may update the number of error bits detected through the non-selection read operation. In addition, whether a memory block is a weak block WB may be determined with reference to the number of error bits detected.

The non-selection read operation and an operation for detecting error bits of a weak block WB at a fixed period are described with reference to FIGS. 8A and 8B.

Figure 9:
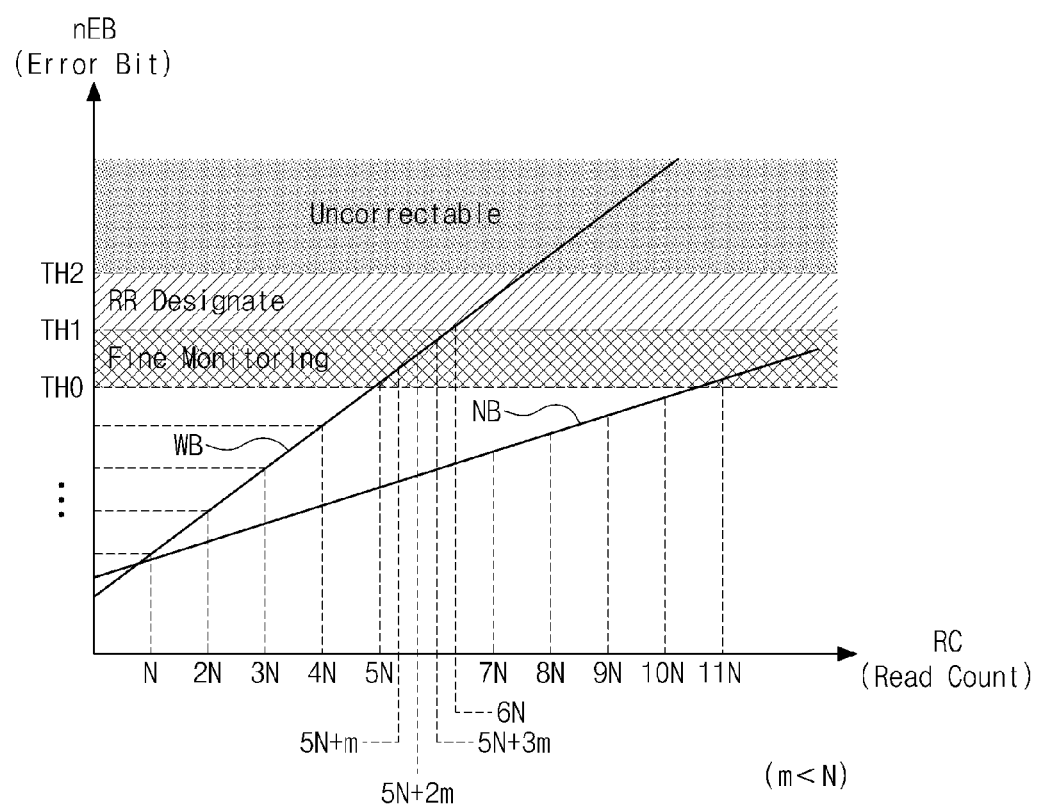
FIG. 9 is a graph illustrating a read reclaim method for a weak block, according to another embodiment of the disclosure.

FIG. 9 is a graph illustrating a read reclaim method of a weak block, according to another embodiment of the disclosure. Referring to FIG. 9, straight lines each indicating the number of error bits nEB for a read count RC are illustrated with respect to a weak block WB and a normal block NB. An error bit increase rate of the weak block WB may be greater than that of the normal block NB. That is, a slope of the straight line indicating the weak block WB may be greater than a slope of the straight line indicating the normal block NB.

First of all, when data is written at a selected memory block, the per-block error bit table 116 for managing a read count RC and the number of error bits nEB for the selected memory block may be created. The error bit increase rate may be detected when a read operation is performed at least two or more times. Whether a memory block is a weak block WB may be determined according to the error bit increase rate EBIR.

In a graph, a memory block determined as a weak block WB may be checked according to a shortened period from a point in time when the number of error bits is greater than or equal to a threshold value TH0 or from a point in time after a specific read count 5N. That is, in the case of the memory block designated as the weak block WB, the number of error bits nEB may be detected whenever a read count is increased by m. Before the specific read count 5N or at a point in time when the number of error bits is smaller than the threshold value TH0, the number of error bits may be detected whenever a read count is increased by N (N>m). That is, with regard to the weak block WB, a period to detect the number of error bits may be shortened after the specific read count 5N or from a point in time when the number of error bits is greater than or equal to the threshold value TH0.

Here, that error bits are detected with regard to any one block may mean that reading and error detection are performed with respect to a surrounding memory area not requested by a host. That is, that error bits are detected may mean that a non-selection read operation is performed. However, an error bit checking manner of FIG. 9 may differ from that of FIG. 6 in that a non-selection read operation is performed with a period (e.g., N) being not a random read count RC. In the case where a host requests a read operation of a specific page included in any one memory block, reading and error detection may be performed with respect to a surrounding page of a read-requested page every specific read count period (e.g., N or m).

If the number of error bits nEB for the weak block WB is detected with a reduced period (e.g., m), the weak block WB may be designated as a read reclaim block at an appropriate time. In the case where the number of error bits for the weak block WB is detected at a constant read count (e.g., N), in the worst case, the weak block WB may be designated as a block with an uncorrectable error, not a read reclaim block. However, if the number of error bits for the weak block WB is detected with the fixed period (e.g., m), the weak block WB may be designated as a read reclaim block at a read count of (e.g., 6N) where the number of error bits nEB is detected as being greater than a threshold value TH1.

Figure 10:
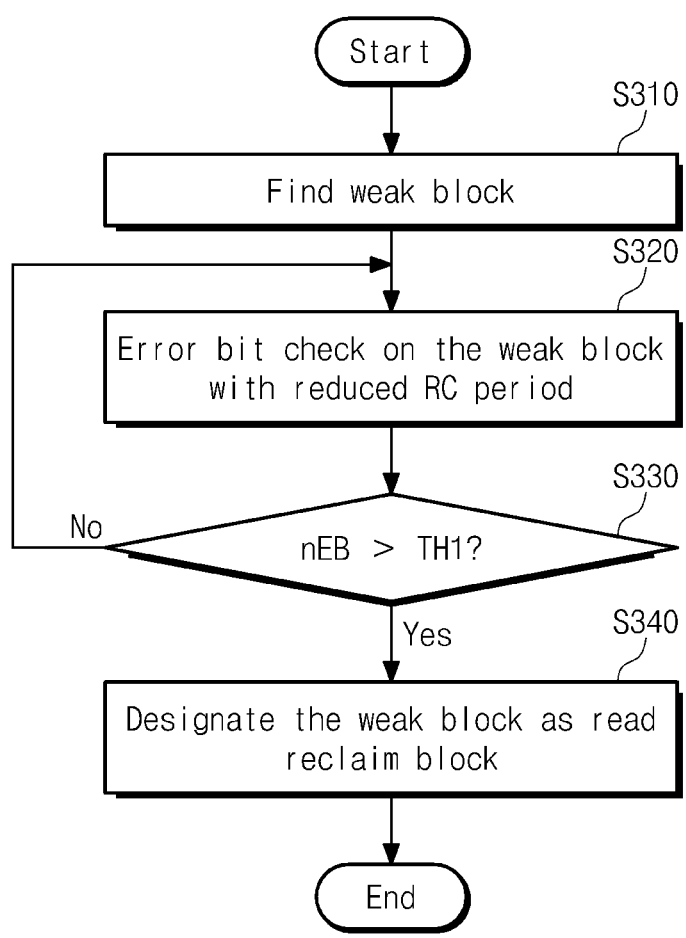
FIG. 10 is a flow chart illustrating a read reclaim method according to an embodiment of the disclosure.

FIG. 10 is a flow chart illustrating a read reclaim method according to an embodiment of the disclosure. Referring to FIG. 10, a read reclaim method according to an embodiment of the disclosure may be characterized in that a weak block is detected and the number of error bits for the detected weak block is detected with a reduced detection period.

In step S310, a weak block WB may be detected. A read count RC for each of the memory blocks where a read operation of written data is requested and the number of error bits nEB detected every read count may be stored in the per-block error bit table 116. A memory block of which the number of error bits is greater than a reference increasing rate may be designated as a weak block WB based on the stored read count RC and the number of error bits nEB. Here, an average value of error bit increase rates of all memory blocks managed in the per-block error bit table 116 may be used as the reference increasing rate of the error bit increase rate EBIR for selecting the weak block WB. Alternatively, a fixed error bit increase rate obtained through experimentation may be used as the reference increasing rate of the error bit increase rate EBIR for selecting the weak block WB.

In step S320, the number of error bits of the weak block WB may be detected with a period shorter than that for a normal block. For example, it may be assumed that for a normal block NB error bits are detected once whenever a read count is increased by 10. However, with regard to a weak block WB, the number of error bits may be counted each time a read count is increased by 2. However, a threshold value TH1 of the number of error bits for assigning a block to a read reclaim block may be equally applied to a weak block WB and a normal block NB.

In step S330, there may be determined whether the number of error bits detected for the weak block WB with a reduced period reaches the threshold value TH1 of the number of error bits nEB for designating a block as a read reclaim block. If the number of error bits nEB detected is not greater than the threshold value TH1 (No), the procedure may return to step S320 to continue to detect the number of error bits with the reduced period. If the number of error bits nEB detected is greater than the threshold value TH1 (Yes), the procedure may proceed to step S340 in which a corresponding weak block WB is designated as a read reclaim block.

In step S340, a weak block WB in which the number of error bits is detected with the reduced period may be designated as a read reclaim block. Although not described, data stored in the weak block WB designated as a read reclaim block may be copied to another normal memory block, and the weak block WB may be erased.

Above, there is described a read reclaim method in which a read reclaim block is designated based on the number of error bits detected with a reduced period with respect to a detected weak block WB. As a weak block WB is detected and the number of error bits nEB is detected with the reduced period, a weak block of which the error bit increase rate EBIR is relatively great may be accurately designated as a read reclaim block. That is, the situation that an uncorrectable error occurs at a weak block of which the error bit increase rate EBIR is relatively great may be prevented.

Figure 11:
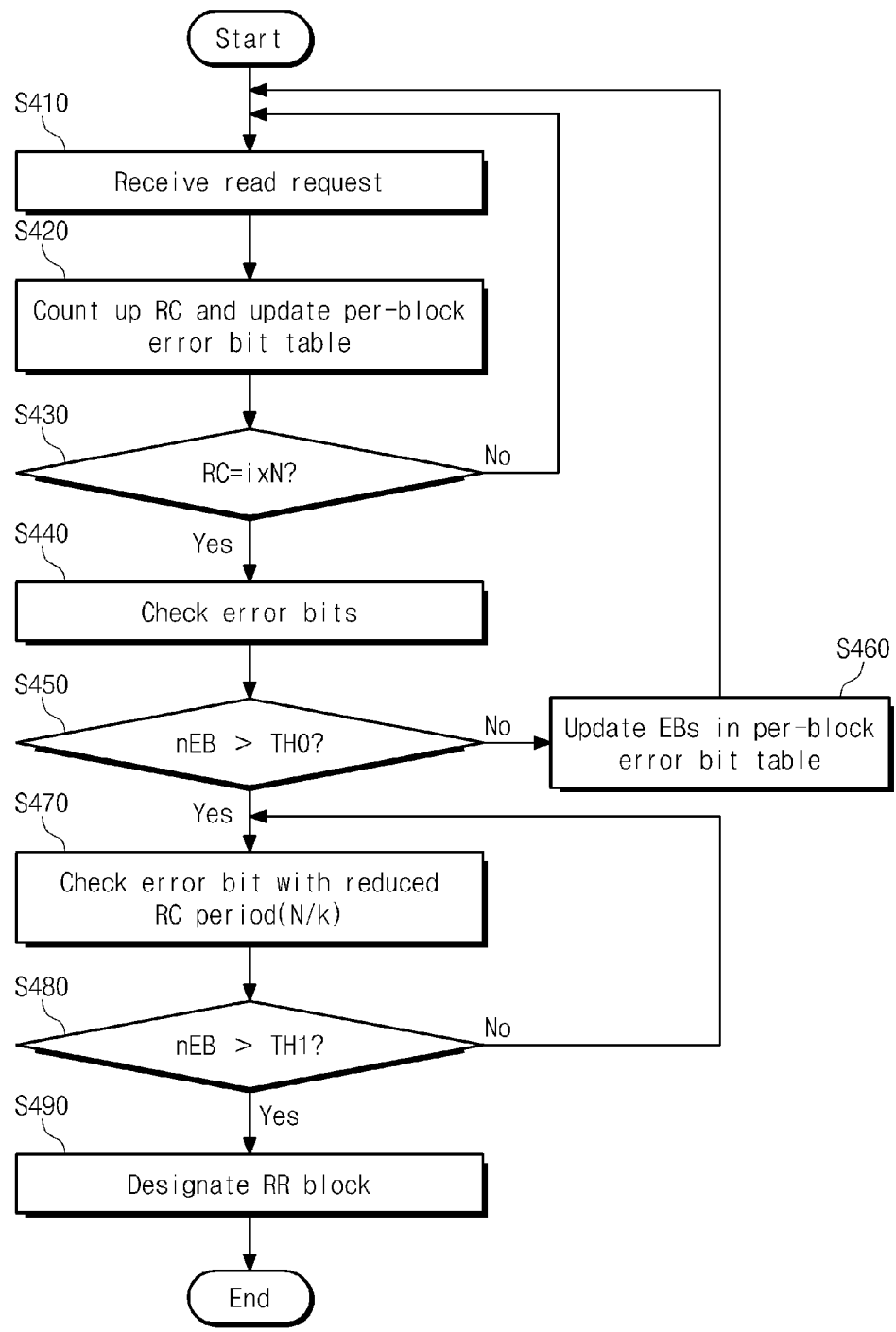
FIG. 11 is a flow chart illustrating a detailed example of a read reclaim method according to the disclosure.

FIG. 11 is a flow chart illustrating a detailed example of a read reclaim method according to the disclosure. Referring to FIG. 11, in a weak block detection section, the number of error bits may be detected whenever a read count is increased by N, and the number of error bits for a detected weak block WB may be detected whenever a read count is increased by m (e.g., corresponding to a value reduced from a value corresponding to a fixed period). This will be described in more detail below.

In step S410, the memory controller 110 may receive a read request from a host. The read reclaim manager 112 of the memory controller 110 may create, maintain, and update the per-block error bit table 116 for managing a read count RC and the number of error bits nEB for each of memory blocks where data is written.

In step S420, the memory controller 110 may increase a read count RC for a memory block where a read request occurs and may update the per-block error bit table 116 with the increased read count. A value of the per-block error bit table 166 may be stored in a specific area of the nonvolatile memory device 120 periodically or as necessary. Accordingly, even though power is removed, it may be possible to maintain information of a read count RC and the number of error bits nEB for each of memory blocks where data is written.

In step S430, whether the updated read count RC corresponds to an error bit detection period N for detecting a weak block WB may be determined. If the read count RC of a read-requested block is not the same as the error bit detection period N (No), the procedure may proceed to step S410 for detecting a next read request. If the read count RC corresponds to an error bit detection period (e.g., a multiple of N) (Yes), the procedure may proceed to step S440 for error detection.

In step S440, the memory controller 110 may read data of a selected memory block of the nonvolatile memory device 120 and may perform an error detection operation for the read data. At this time, the error detection operation may be performed by the error correction block 117 of the memory controller 110.

In step S450, the memory controller 110 may determine whether a memory block from which data is read is a weak block WB, independently of error correction and data output. That is, if the error bit increase rate for a read count is calculated, whether a memory block is a weak block WB may be determined. A memory block of which the error bit increase rate is determined as being greater than a reference value may be designated as a weak block WB. If a memory block from which error bits are detected is not a weak block WB (No), the procedure may proceed to step S460. If the result of calculating the error bit increase rate indicates that the memory block is a weak block WB (Yes), the procedure may proceed to step S470.

In step S460, the per-block error bit table 116 may be updated with the number of error bits nEB of a memory block which is determined as a normal block NB based on the error bit increase rate. Afterwards, the procedure may return to step S410 to receive a read request.

In step S470, the procedure for managing a weak block WB may start. That is, the number of error bits nEB for the weak block WB may be detected with a reduced read count period m. Here, the reduced read count period m may be used with respect to a read request from the host. Alternatively, regardless of a read request from the host, the memory controller 110 may read data from a weak block WB with the reduced read count period m and may detect an error of the read data. Here, the reduced read count period m may be shorter than the above-described weak block detection period N.

In step S480, whether the number of error bits detected from the weak block WB is greater than a threshold value TH1 for designating a block as a read reclaim block may be determined. If the number of error bits nEB detected with respect to the weak block WB is greater than the threshold value TH1 (Yes), the procedure may proceed to step S490. If the number of error bits nEB detected with respect to the weak block WB is smaller than or equal to the threshold value TH1 (No), the procedure may return to step S470, in which the number of error bits is detected with a reduced period.

In step S490, the memory controller 110 may perform a read reclaim procedure about a weak block WB in which the number of error bits nEB detected becomes greater than the threshold value TH1 for designating a block as a read reclaim block. If a block is designated by the memory controller 110 as a read reclaim block, the data copy and erase procedure may be performed under control of the read reclaim manager 112.

A read reclaim method according to an embodiment of the disclosure is described above.

Figure 12:
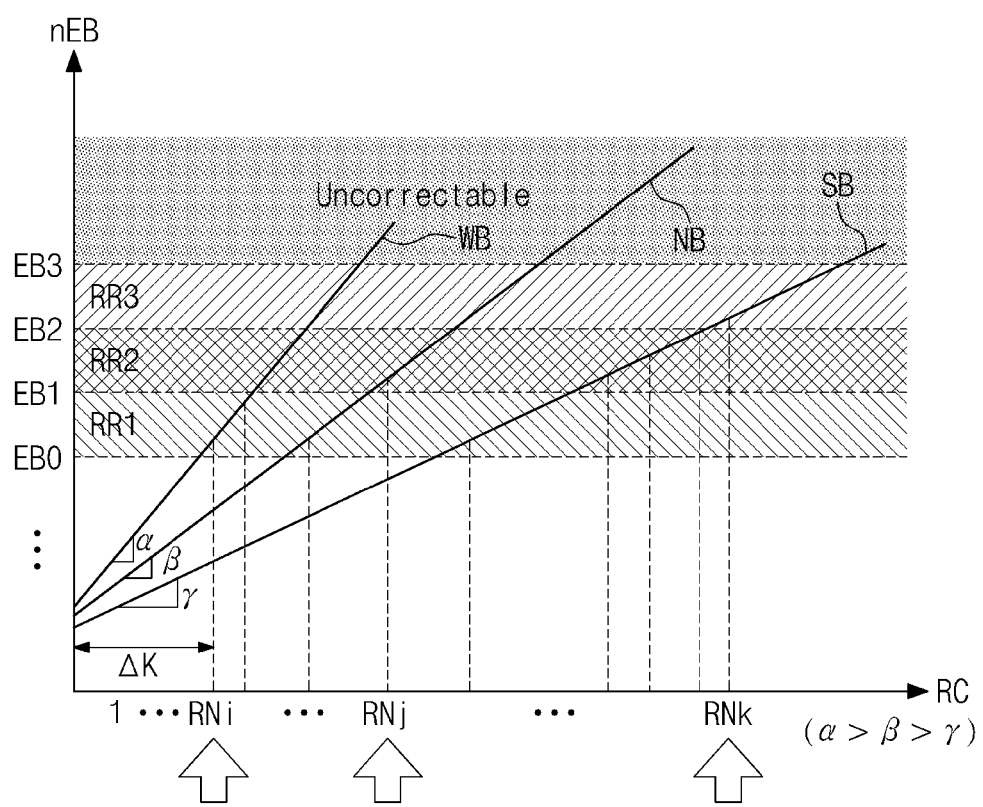
FIG. 12 is a graph illustrating a read reclaim method according to another embodiment of the disclosure.

FIG. 12 is a graph illustrating a read reclaim method according to another embodiment of the disclosure. Referring to FIG. 12, memory blocks may be classified into at least two or more groups based on an error bit increase rate, and different read reclaim references may be applied to the groups, respectively.

A read count RC and the number of error bits nEB of each memory block may be detected. That is, the number of error bits nEB may be detected every specific read count (e.g., a random read count), and the per-block error bit table 116 may be updated with the detected number of error bits. After data is written in the memory blocks, an error bit increase rate for a read count RC may be detected and calculated during a specific section ΔK. Memory blocks where an error bit increase rate is calculated may be classified into at least two groups, based on an error characteristic. An embodiment of the disclosure is exemplified in FIG. 12 that memory blocks are classified into three groups WB, NB, and SB. However, the scope and spirit of the disclosure may not be limited thereto. For example, memory blocks may be classified into two groups or four or more groups based on the magnitude of the error bit increase rate.

With regard to three memory blocks, error bit increase rates of a read count RC may be different in magnitude from each other. In the graph of FIG. 12, straight lines may correspond to a weak block WB with an error bit increase rate of "α", a normal block NB with an error bit increase rate of "β" (α>β), and a strong block SB with an error bit increase rate of "γ" (β>γ). Memory blocks may be classified in a section ΔK for calculating an error bit increase rate.

If memory blocks are completely classified according to an error characteristic, read reclaim references EB0, EB1, and EB2 with different magnitudes may be respectively applied to the memory blocks WB, NB, and SB. That is, the weak block WB may be designated as a read reclaim block when the number of error bits nEB is greater than or equal to the first reference value EB0. The normal block NB may be designated as a read reclaim block when the number of error bits nEB is greater than or equal to the second reference value EB1. The strong block SB may be designated as a read reclaim block when the number of error bits nEB is greater than or equal to the third reference value EB2.

In summary, in an embodiment, different reference values of the number of error bits used to designate a block as a read reclaim block may be respectively applied to memory blocks with different error characteristics. If the above-mentioned read reclaim references EB0, EB1, and EB2 are applied according to the classified groups, the number of error bits for the weak block WB may be detected at an RNi-th read count RNi (i being a natural number). The number of error bits thus detected may be greater than or equal to the first reference value EB0. Accordingly, a weak block WB may be designated as a read reclaim block at a read count RNi. In contrast, the number of error bits of the normal block NB may reach the second reference value EB1 at an RNj-th read count RCj (j being a natural number). Accordingly, the normal block NB may be designated as a read reclaim block at the read count RNj. The number of error bits of the strong block SB may reach the third reference value EB2 at an RNk-th read count RCk (k being a natural number). Accordingly, the strong block SB may be designated as a read reclaim block at the read count RNk.

An embodiment of the disclosure is exemplified in which different reference values for designating a block as a read reclaim block are applied to memory blocks based on error characteristics. In the above-described embodiment, an error bit detection period for remaining pages other than a selected page may not be changed. However, a time when a weak block is designated as a read reclaim block may become relatively short by finely applying a read reclaim reference to a memory block of which the error characteristic is bad.

Figure 13:
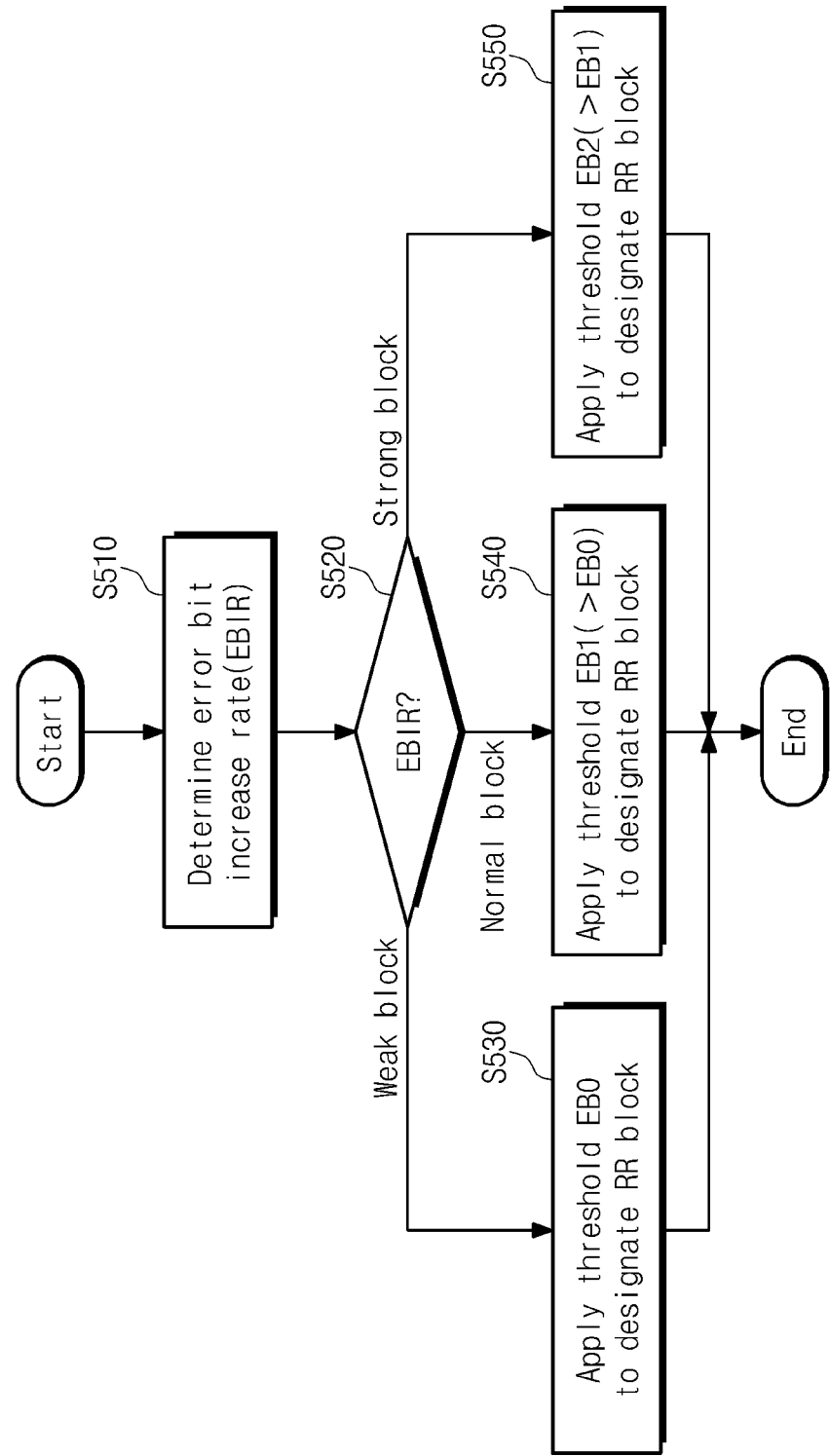
FIG. 13 is a flow chart illustrating a read reclaim method illustrated in FIG. 12, according to an embodiment of the disclosure.

FIG. 13 is a flow chart illustrating a read reclaim method illustrated in FIG. 12, according to an embodiment of the disclosure. Referring to FIG. 13, classification of memory blocks according to error characteristics and the numbers of error bits with different magnitudes may be applied as a read reclaim reference.

In step S510, an error bit increase rate EBIR of a memory block at which data is written may be calculated at a read count RC. The error bit increase rate EBIR may be calculated when a read operation is performed at least two times. However, to improve accuracy, the error bit increase rate EBIR may be calculated with reference to the number of error bits detected when a read operation is performed three or more times.

In step S520, an operation may diverge according to the error bit increase rate EBIR. If a memory block is classified as a weak block WB based on the error bit increase rate EBIR, the procedure may proceed to step S530. If a memory block is classified as a normal block NB based on the error bit increase rate EBIR, the procedure may proceed to step S540. If a memory block is classified as a strong block SB based on the error bit increase rate EBIR, the procedure may proceed to step S550.

In step S530, the RR manager 112 may apply a specific read reclaim reference to a memory block classified as the weak block WB. That is, a memory block classified as the weak block WB may be designated as a read reclaim block when the number of error bits nEB detected is greater than or equal to the first reference value EB0.

In step S540, the RR manager 112 may apply a specific read reclaim reference to a memory block classified as the normal block NB. That is, a memory block classified as the normal block NB may be designated as a read reclaim block when the number of error bits nEB detected is greater than or equal to the second reference value EB1.

In step S550, the RR manager 112 may apply a specific read reclaim reference to a memory block classified as the strong block SB. That is, a memory block classified as the strong block SB may be designated as a read reclaim block when the number of error bits nEB detected is greater than or equal to the third reference value EB2.

An embodiment of the disclosure is exemplified in FIG. 13 in which different read reclaim references are applied to memory blocks based on error characteristics. According to the read reclaim method, a weak block WB of which the error bit increase rate is relatively great may be designated as a read reclaim block at a relatively small read count RC. Accordingly, the probability that an uncorrectable error occurs in reading a weak block WB may be markedly reduced.

Figure 14:
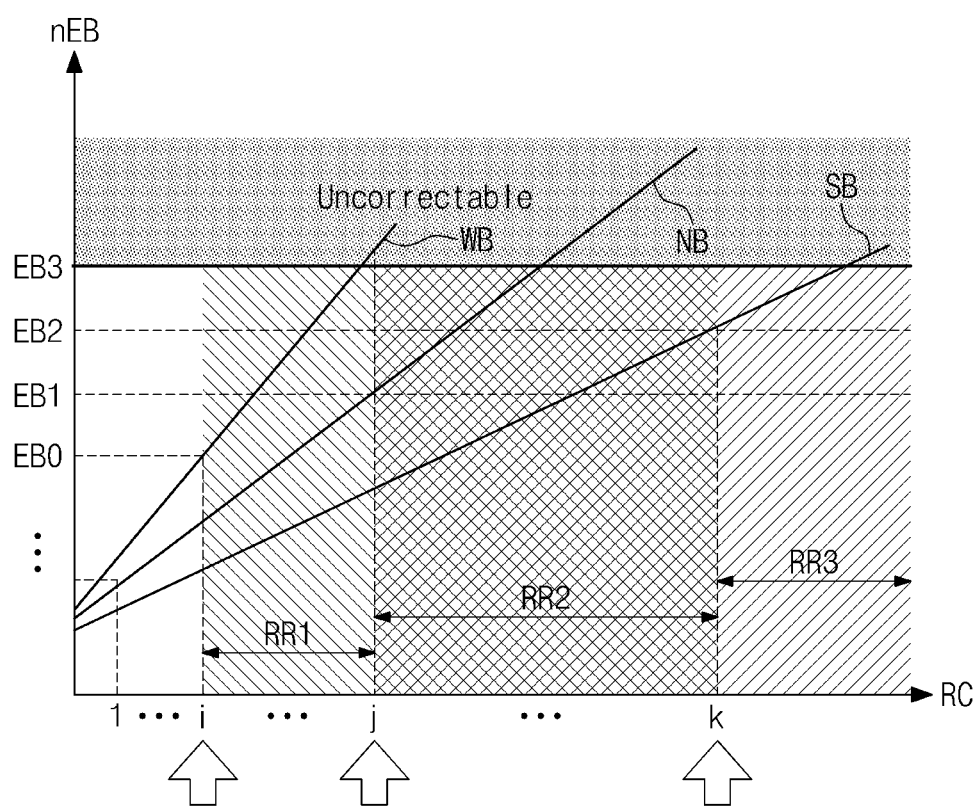
FIG. 14 is a graph illustrating a read reclaim method according to still another embodiment of the disclosure.

FIG. 14 is a graph illustrating a read reclaim method according to still another embodiment of the disclosure. Referring to FIG. 14, memory blocks may be classified into at least two or more groups based on an error bit increase rate. Different read count references for read reclaim may be applied to the groups, respectively.

A method for classifying memory blocks using an error bit increase rate is described with reference to FIG. 12, and a description thereof is thus omitted. Memory blocks may be classified into a plurality of groups based on a manner described with reference to FIG. 12. An embodiment of the disclosure is exemplified in FIG. 13 that memory blocks are classified into three groups WB, NB, and SB.

If memory blocks are completely classified according to an error characteristic, read reclaim references i, j, and k with different magnitudes may be respectively applied to the memory blocks WB, NB, and SB. That is, the weak block WB may be designated as a read reclaim block when the read count RC is greater than or equal to the first read count i. The normal block NB may be designated as a read reclaim block when the read count RC is greater than or equal to the second read count j. The strong block SB may be designated as a read reclaim block when the read count RC is greater than or equal to the third read count j.

In summary, in an embodiment, different read counts used to designate a block as a read reclaim block may be respectively applied to memory blocks with different error characteristics. A time when a weak block WB is designated as a read reclaim block may become relatively short by applying the different read reclaim references i, j, and k to classified groups. Accordingly, it may be possible to prevent a read error due to an uncorrectable error from occurring at a block of which the error characteristic is bad.

Figure 15:
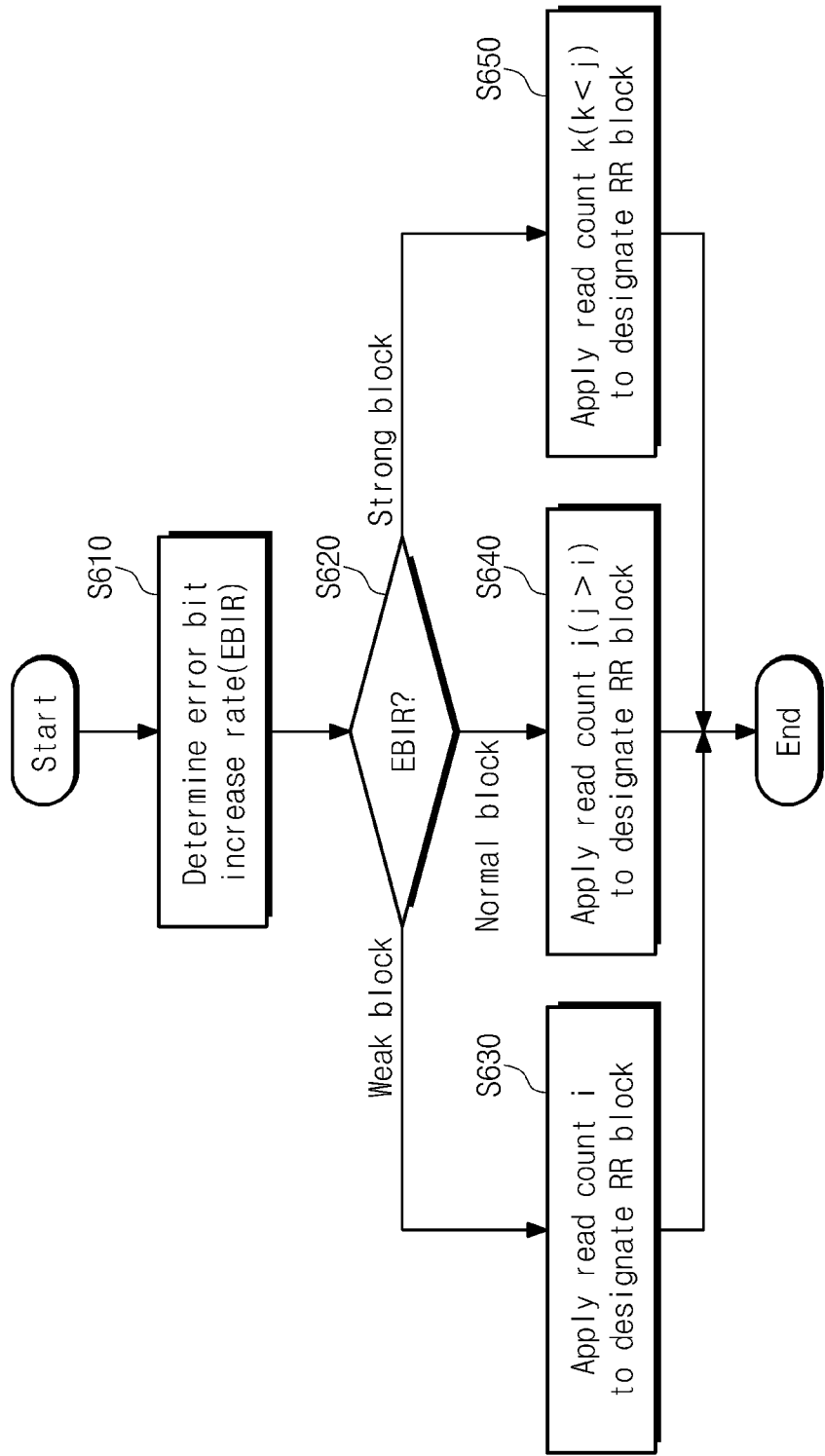
FIG. 15 is a flow chart illustrating a read reclaim method illustrated in FIG. 14, according to an embodiment of the disclosure.

FIG. 15 is a flow chart illustrating a read reclaim method illustrated in FIG. 14, according to an embodiment of the disclosure. Referring to FIG. 15, classification of memory blocks according to error characteristics and the numbers of error bits with different magnitudes may be applied as a read reclaim reference.

In step S610, an error bit increase rate EBIR of a memory block in which data is written may be calculated at a read count RC. The error bit increase rate EBIR may be calculated when a read operation is performed at least two times. However, to improve accuracy, the error bit increase rate EBIR may be calculated with reference to the number of error bits detected when a read operation is performed three or more times.

In step S620, an operation may diverge according to the error bit increase rate EBIR. If a memory block is classified as a weak block WB based on the error bit increase rate EBIR, the procedure may proceed to step S630. If a memory block is classified as a normal block NB based on the error bit increase rate EBIR, the procedure may proceed to step S640. If a memory block is classified as a strong block SB based on the error bit increase rate EBIR, the procedure may proceed to step S650.

In step S630, the RR manager 112 may apply a specific read reclaim reference to a memory block classified as the weak block WB. That is, a memory block classified as the weak block WB may be designated as a read reclaim block when the magnitude of the read count RC detected is greater than or equal to the first read count i.

In step S640, the RR manager 112 may apply a specific read reclaim reference to a memory block classified as the normal block NB. That is, a memory block classified as the normal block NB may be designated as a read reclaim block when the magnitude of the read count RC detected is greater than or equal to the second read count j.

In step S650, the RR manager 112 may apply a specific read reclaim reference to a memory block classified as the strong block SB. That is, a memory block classified as the strong block SB may be designated as a read reclaim block when the magnitude of the read count RC detected is greater than or equal to the third read count k.

An embodiment of the disclosure is exemplified in FIG. 15 in which different read reclaim references are applied to memory blocks based on error characteristics. According to the read reclaim method, a weak block WB of which the error bit increase rate is relatively great may be designated as a read reclaim block at a relatively small read count RC. Accordingly, the probability that an uncorrectable error occurs in reading a weak block WB may be markedly reduced.

An embodiment of the disclosure is exemplified in FIG. 12 in which the number of error bits for designating a block as a read reclaim block is variable according to the characteristics of memory blocks. An embodiment of the disclosure is exemplified in FIG. 14 in which the magnitude of a read count for designating a block as a read reclaim block is variable according to the error characteristics of memory blocks. It should be appreciated that a block may be designated as a read reclaim block through a combination of a method of FIG. 12 and a method of FIG. 14.

Figure 16:
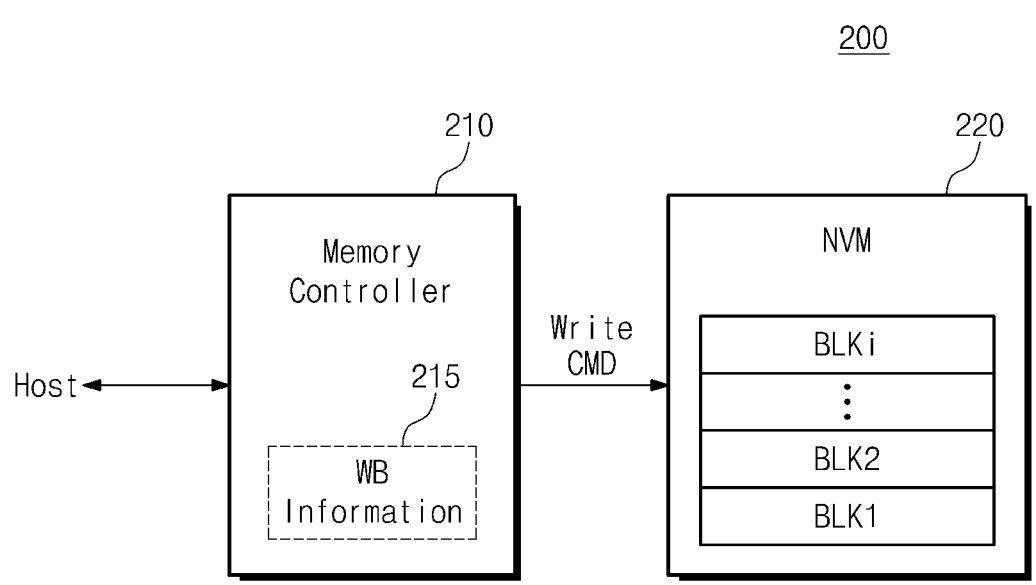
FIG. 16 is a block diagram illustrating a storage device according to another embodiment of the disclosure.

FIG. 16 is a block diagram illustrating a storage device according to another embodiment of the disclosure. Referring to FIG. 16, a storage device 200 may include a memory controller 210 and a nonvolatile memory device 220. The nonvolatile memory device 220 is substantially the same as the nonvolatile memory device 120 of FIG. 1, and a detailed description thereof is thus omitted.

The memory controller 210 may create and maintain information about a weak block WB of which the error bit increase rate is relatively great. In addition, the memory controller 210 may manage a weak block WB based on a read reclaim manner described with reference to FIGS. 1 to 15. In particular, the memory controller 210 may assign a memory block based on a pattern of write-requested data and information about the weak block WB.

The memory controller 210 may detect error characteristics of memory blocks based on substantially the same manner as the memory controller 110. In particular, a weak block WB may be determined according to detection of the error bit increase rate EBIR. The memory controller 210 may use weak block WB information 215 about the weak block during an operation except for the read reclaim operation. For example, during a data write operation, the memory controller 210 may perform block assignment such that data of a specific write pattern is written at a weak block. Data which is frequently updated or written with the same logical address may be referred to as "hot data." The memory controller 210 may perform block assignment such that hot data is written at a weak block WB.

Figure 17:
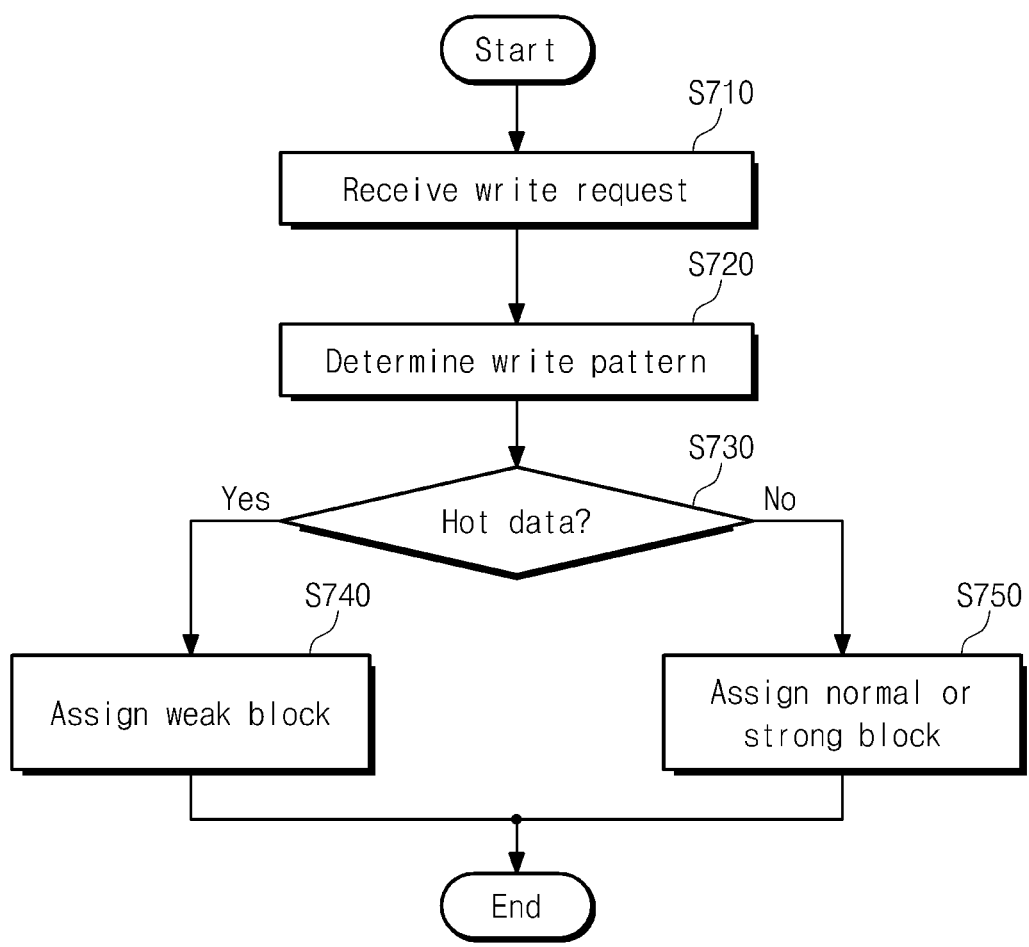
FIG. 17 is a flow chart illustrating a data write method using weak block information.

FIG. 17 is a flow chart illustrating a data write method using weak block information. Referring to FIG. 17, a weak block WB may be assigned to a memory block for writing data of a specific pattern (e.g., hot data).

In step S710, the memory controller 210 may receive a write request from a host.

In step S720, the memory controller 210 may determine attributes or a pattern of write-requested data. The memory controller 210 may determine the pattern or attributes of the write-requested data with reference to a write-requested logical address. For example, data which is frequently updated or corrected may be determined as hot data. A reference for distinguishing between hot data and cold data may be changed according to various algorithms for determining data attributes.

In step S730, an operation may diverge according to the attributes of data. If the write-requested data is determined as being hot data (Yes), the procedure may proceed to step S740. If the write-requested data is determined as being not hot data (No), the procedure may proceed to step S750.

In step S740, the memory controller 210 may assign a weak block WB to a memory block for writing the write-requested data. Address information about the weak block WB may be continuously maintained in the memory controller 210 or may be updated in the memory controller 210.

In step S750, the memory controller 210 may assign a normal block NB or a strong block SB, not the weak block WB, to a memory block for writing the write-requested data.

A data write method using weak block information is described with reference to FIG. 17. The memory controller 210 may detect the pattern or attributes of write-requested data, and data of a specific pattern or attributes may be stored in the weak block WB. In the case where hot data frequently changed is stored, an erase point in time may accelerate according to a characteristic of the flash memory device incapable of being overwritten. Accordingly, in the case of writing hot data at a weak block, there may be no need to consider an increase in error bits due to read disturbance.

Figure 18:
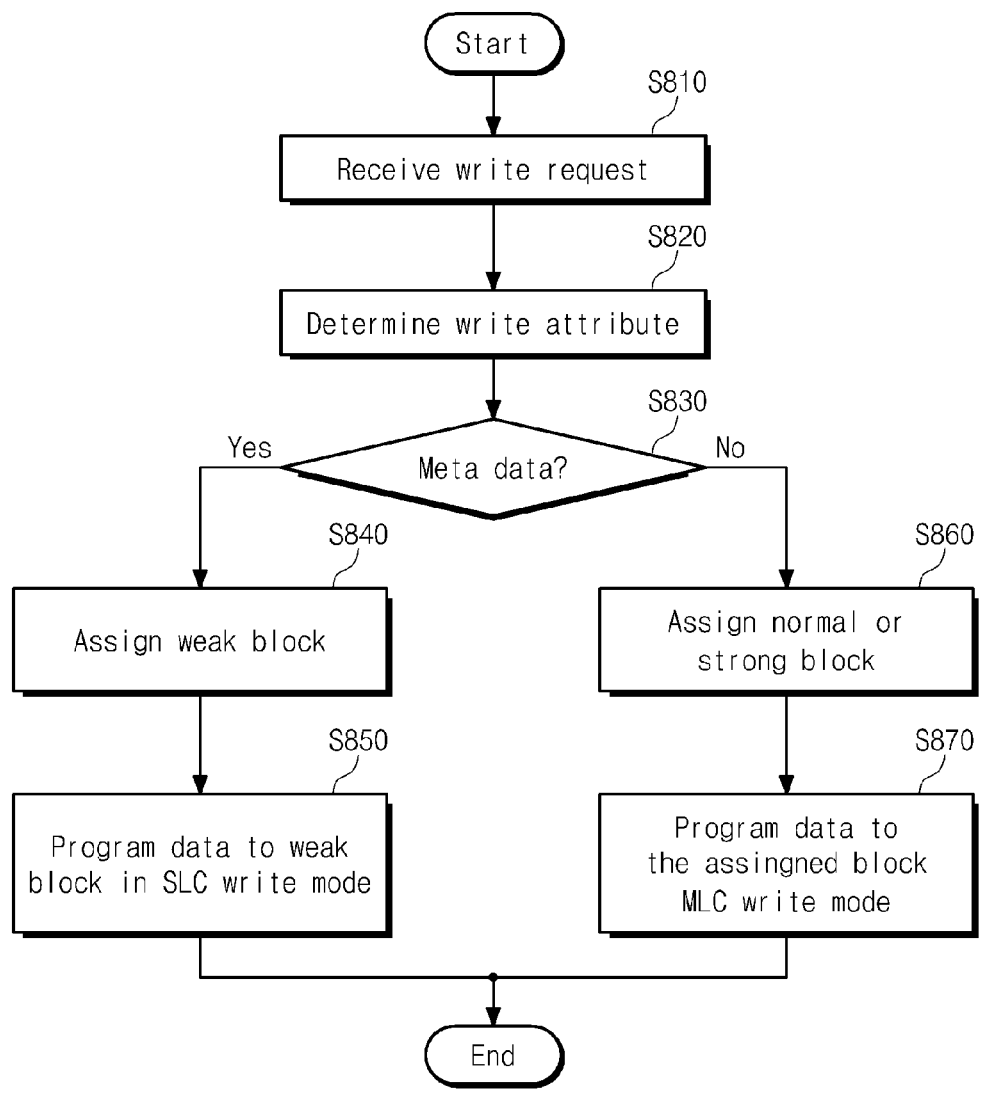
FIG. 18 is a flow chart illustrating another example of a data write method using weak block information.

FIG. 18 is a flow chart illustrating another example of a data write method using weak block information. Referring to FIG. 18, a weak block WB may be assigned to a memory block for writing data of specific attributes (e.g., metadata). Data may be written at a selected weak block in a single level cell (SLC) manner.

In step S810, the memory controller 210 may receive a write request from a host.

In step S820, the memory controller 210 may determine attributes of write-requested data. The memory controller 210 may determine the attributes of the write-requested data with reference to various information. For example, the memory controller 210 may detect the attributes of data with reference to a tag or various attribute information from the host. Below, metadata may be used as an example of the attributes of data.

In step S830, an operation may diverge according to the attributes of data. If the write-requested data is determined as being metadata (Yes), the procedure may proceed to step S840. If the write-requested data is determined as being not metadata (No), the procedure may proceed to step S860.

In step S840, the memory controller 210 may assign a weak block WB as a memory block for writing the write-requested data. Address information of the weak block WB may be continuously maintained in the memory controller 210 or may be updated in the memory controller 210.

In step S850, the memory controller 210 may write the write-requested data at the weak block WB in the SLC write mode.

In step S860, the memory controller 210 may assign a normal block NB or a strong block SB as a memory block for writing the write-requested data.

In step S870, the memory controller 210 may write the write-requested data at the selected memory block in an MLC write mode.

Figure 19:
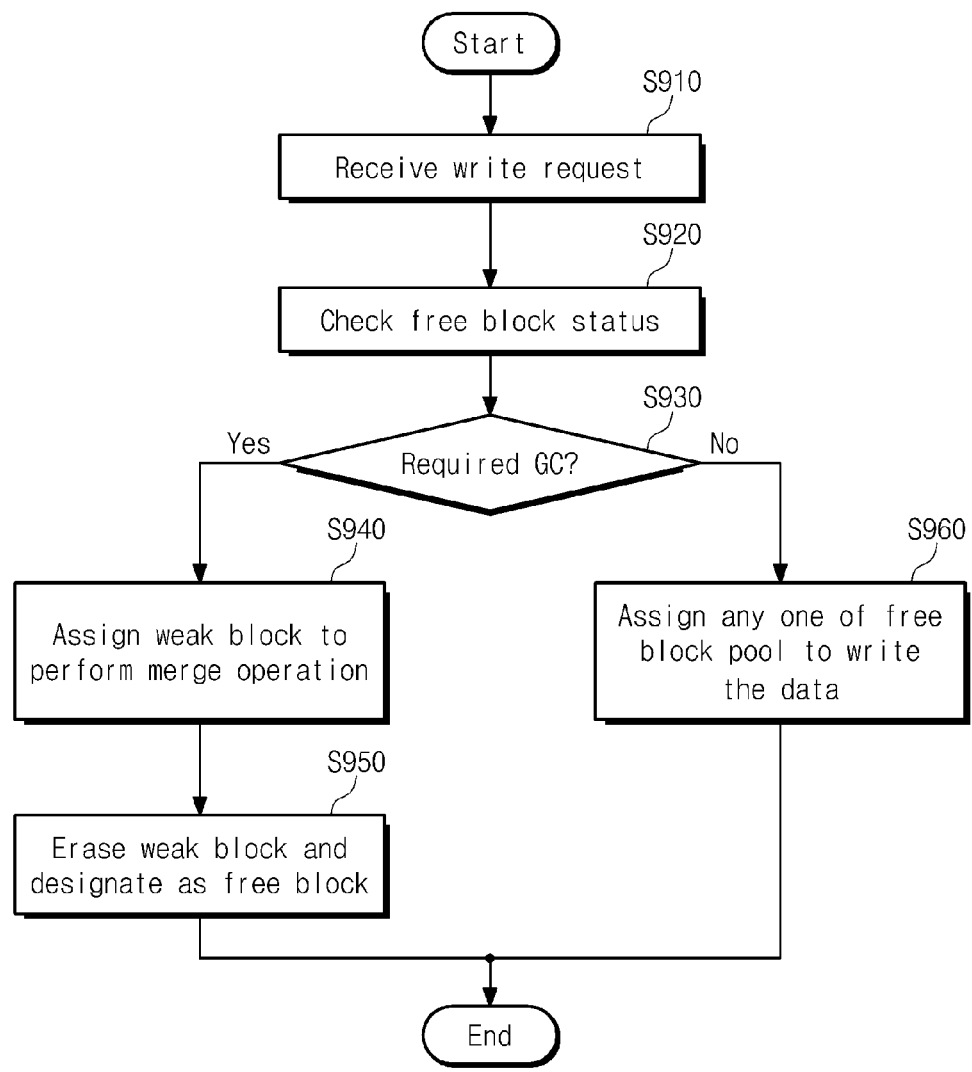
FIG. 19 is a flow chart illustrating another example of a data write method using weak block information.

FIG. 19 is a flow chart illustrating another example of a data write method using weak block information. Referring to FIG. 19, the memory controller 210 may, first, assign a weak block to a merge target in a situation where a garbage collection operation or a merge operation is urgently performed due to a lack of free blocks. This will be described in more detail below.

In step S910, the memory controller 210 may receive a write request from a host.

In step S920, the memory controller 210 may check a status of free blocks to select a memory block at which write-requested data is to be written. For example, the memory controller 210 may determine whether available free blocks are sufficiently included in a free block pool.

In step S930, the memory controller 210 may determine whether a garbage collection operation is required. For example, in the case where the number of free blocks is insufficient, the garbage collection operation may be quickly performed to obtain free blocks. As a consequence of determining that the garbage collection operation is required, the procedure may proceed to step S940. In contrast, as a consequence of determining that the number of free blocks is sufficient, the procedure may proceed to step S960.

In step S940, the memory controller 210 may designate a weak block WB as a candidate of a memory block to be merged for the garbage collection.

In step S950, the memory controller 210 may copy data stored in the weak block selected for the garbage collection and may perform an erase operation on the weak block. The erased weak block may be designated as a free block.

In step S960, the memory controller 210 may select any block, which exists in the free block pool, as a memory block at which data is to be written, without execution of the garbage collection operation.

Various embodiments using weak block information are described with reference to FIGS. 16 to 19. However, the scope and spirit of the disclosure may not be limited thereto.

Figure 20:
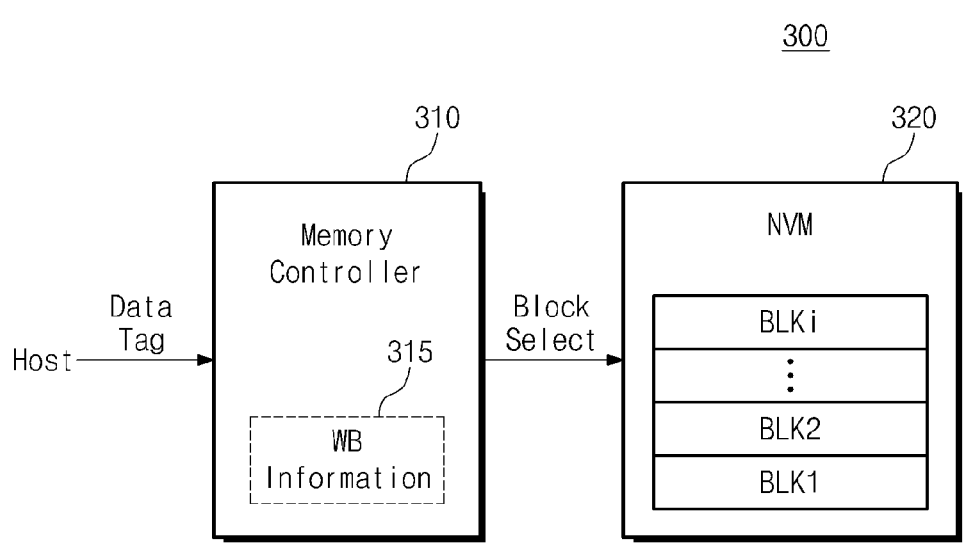
FIG. 20 is a block diagram illustrating a storage system according to still another embodiment of the disclosure.

FIG. 20 is a block diagram illustrating a storage device according to still another embodiment of the disclosure. Referring to FIG. 20, a storage device 300 may include a memory controller 310 and a nonvolatile memory device 320. The nonvolatile memory device 320 is substantially the same as the nonvolatile memory device 120 of FIG. 1 or the nonvolatile memory device 220 of FIG. 16, and a detailed description thereof is thus omitted.

The memory controller 310 may create and maintain information about a weak block WB of which the error bit increase rate EBIR is relatively great. The memory controller 310 may perform a read reclaim operation for a weak block WB based on one of the manners described with reference to FIGS. 1 to 15. The memory controller 310 may assign a weak block or a normal block based on attributes of write-requested data. The attributes of data may be included in a data tag from a host.

The memory controller 310 may obtain attributes or pattern information of data with reference to a data tag included in a write request or a command from the host. The memory controller 310 may select a memory block, at which write-requested data is to be written, based on the attributes or pattern of data detected through the data tag. Here, the attributes or pattern of data contained in the data tag may be information indicating whether the write-requested data is hot data or whether a pattern of the write-requested data is a sequential pattern or a random pattern. However, the scope and spirit of the disclosure may not be limited thereto. For example, a variety of information may be contained in a data tag.

For example, in the case where the attributes of write-requested data included in the data tag is associated with hot data, the memory controller 310 may select a weak block WB as a memory block at which the write-requested data is to be stored.

Figure 21:
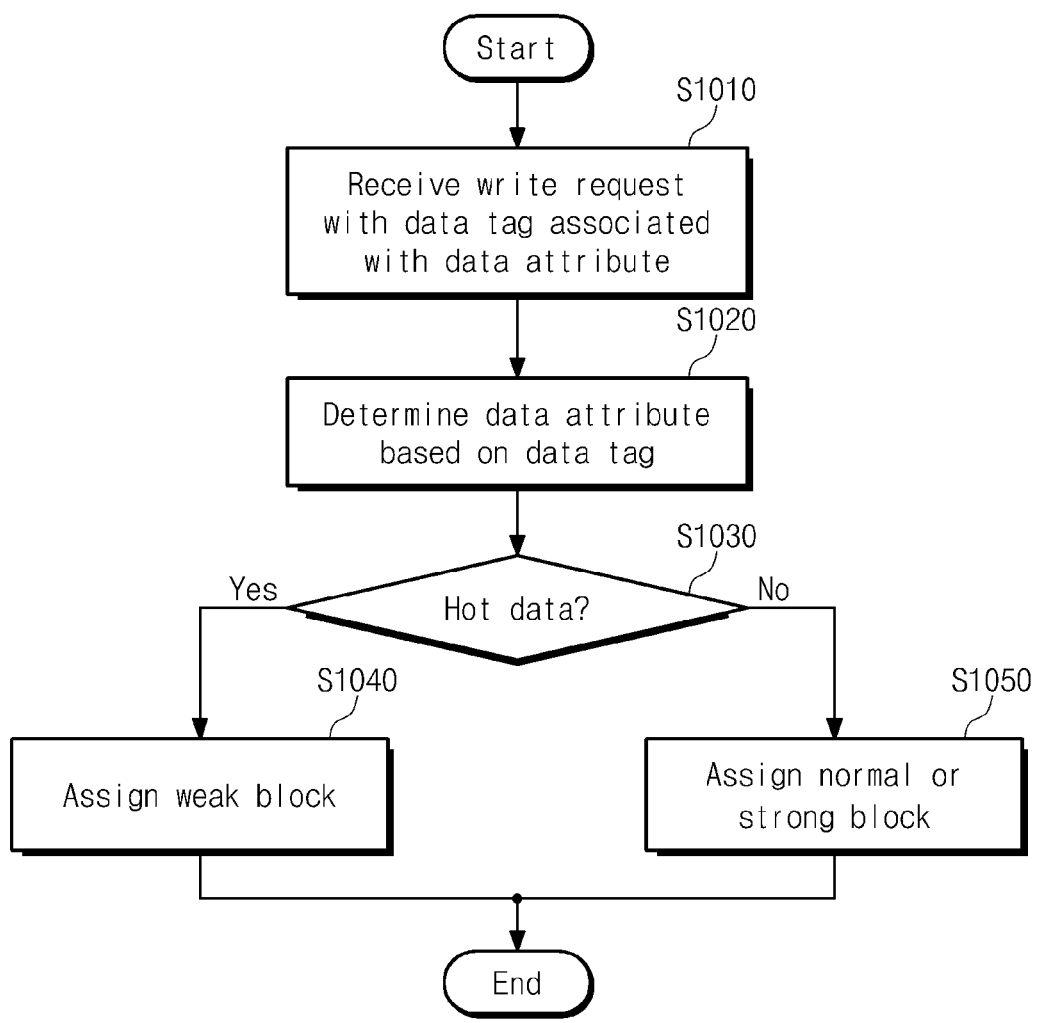
FIG. 21 is a flow chart illustrating a method for assigning a memory block with reference to hint information of a host.

FIG. 21 is a flow chart illustrating a method for assigning a memory block with reference to hint information of a host. Referring to FIG. 21, a weak block WB or a normal block NB may be assigned with reference to a data tag provided from a host.

In step S1010, the memory controller 310 may receive a write request from a host. In an embodiment, a write command, an address, or data provided from the host may include a data tag defining the attributes or pattern of the write-requested data.

In step S1020, the memory controller 310 may determine the attributes or pattern of write-requested data based on the data tag.

In step S1030, an operation may diverge according to the attributes of data. If the write-requested data is determined as being hot data (Yes), the procedure may proceed to step S1040. If the write-requested data is determined as being not hot data (No), the procedure may proceed to step S1050.

In step S1040, the memory controller 310 may assign a weak block WB to a memory block for writing the write-requested data. Address information about the weak block WB may be continuously maintained in the memory controller 310 or may be updated in the memory controller 210.

In step S1050, the memory controller 310 may assign a normal block NB or a strong block SB, not the weak block WB, to a memory block for writing the write-requested data.

A data write method using weak block information is described with reference to FIG. 17. The memory controller 310 may detect the pattern or attributes of write-requested data with reference to the data tag from the host, and data with the specific pattern or attributes may be stored in the weak block WB.

Figure 22:
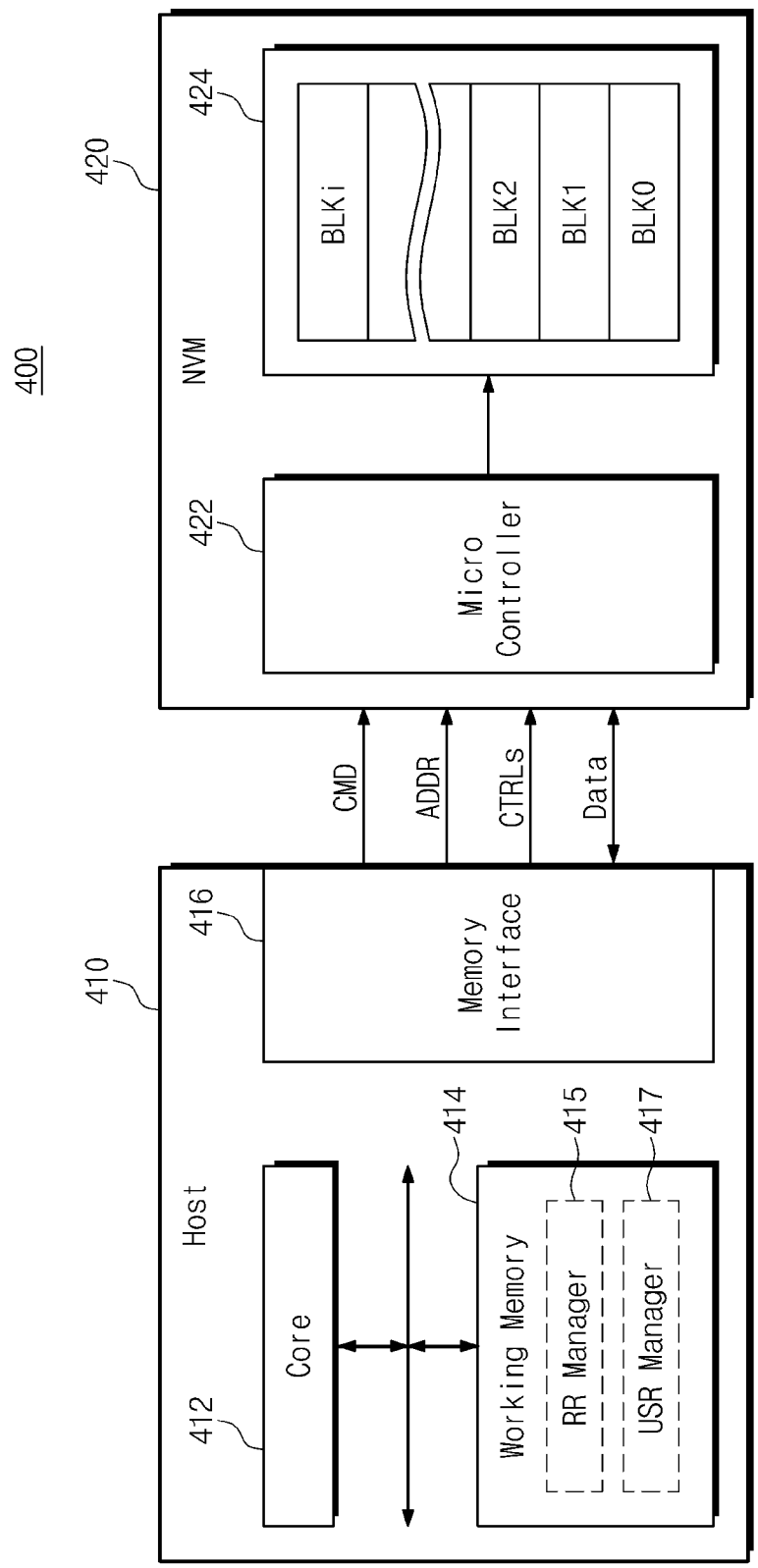
FIG. 22 is a block diagram illustrating a user system according to another embodiment of the disclosure.

FIG. 22 is a block diagram illustrating a user system according to another embodiment of the disclosure. Referring to FIG. 22, a user system 400 may include a host 410 and a storage device 420. The host 410 may include a core 412, a working memory 414, and a memory interface 416. The storage device 420 may include a microcontroller 422 and a nonvolatile memory device 424. Here, the storage device 420 may be implemented with a perfect page new (PPN) device.

The core 412 of the host 410 may execute various application programs loaded on the working memory 414 or may process data loaded on the working memory 414. Software such as an operating system and an application program may be loaded on the working memory 414. In particular, an algorithm or software modules such as the read reclaim (RR) manager 415 and a non-selection read (USR) manager 417 of the disclosure may be loaded on an operating system which is loaded on the working memory 414.

The memory interface 416 may convert a memory address access-requested by the core 412 into a physical address. The memory interface 416 may perform, for example, a function of a flash translation layer (FTL).

Under control of the host 410, the RR manager 415 and the USR manager 417 may classify memory blocks of the storage device 420 based on an error bit increase rate. The RR manager 415 and the USR manager 417 may manage a memory block classified as a weak block with a fixed error bit detection period. If the number of error bits detected is greater than or equal to a specific threshold value, the weak block may be designated as a read reclaim block.

The storage device 420 may include the microcontroller 422 and the nonvolatile memory device 424. The microcontroller 422 may provide the nonvolatile memory device 424 with a command CMD, an addresses ADDR, control signals CTRLs, and data, Data, from the host 410.

Figure 23:
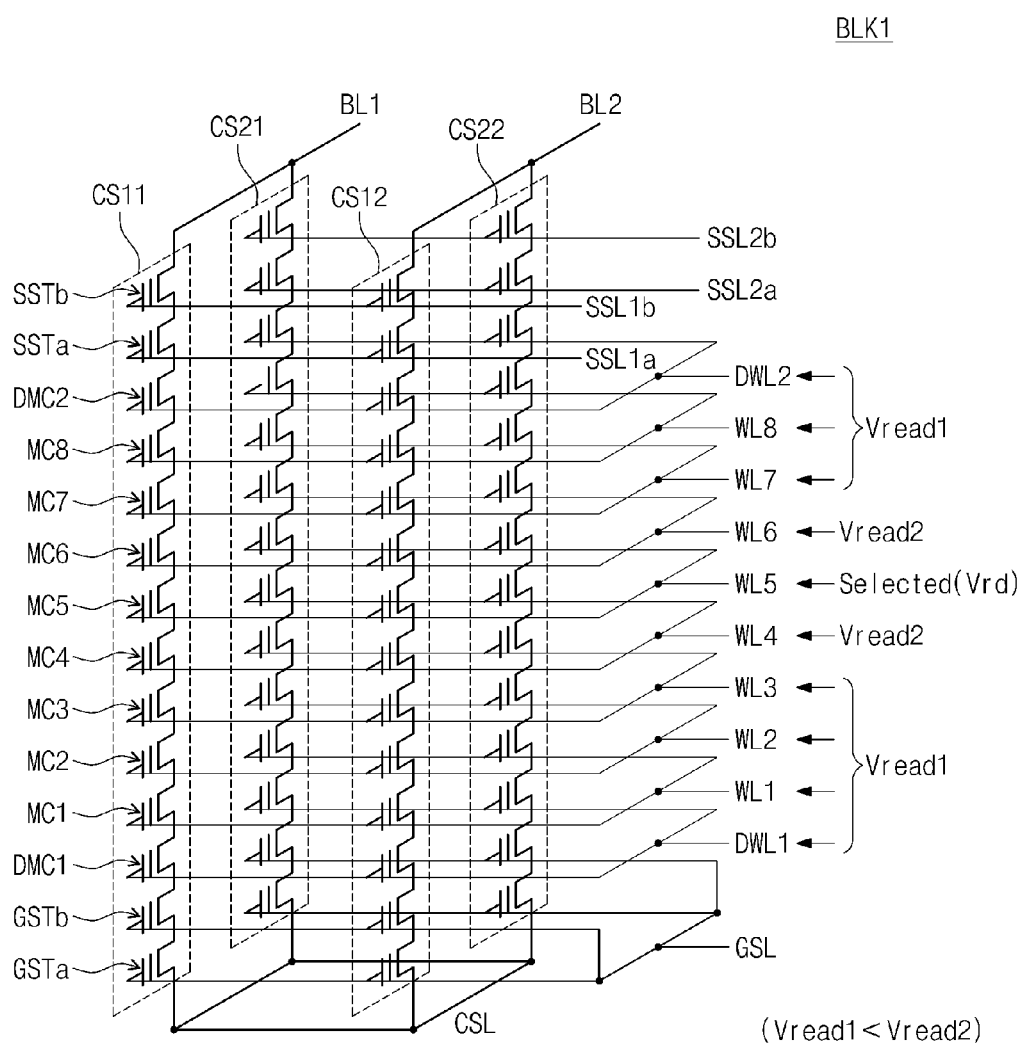
FIG. 23 is a circuit diagram illustrating a first memory block of memory blocks included in a memory cell array described with reference to FIGS. 1, 4, 16, 20, and 22.

FIG. 23 is a circuit diagram illustrating a first memory block BLK1 of memory blocks included in a memory cell array described with reference to FIGS. 1, 4, 16, 20, and 22. In an embodiment, a first memory block BLK1 having a three-dimensional structure will be described with reference to FIG. 23. However, the scope and spirit of the disclosure may not be limited thereto. For example, other memory blocks respectively included in the nonvolatile memory device 423 may have a structure which is similar to the first memory block BLK1.

Referring to FIG. 23, the first memory block BLK1 may include a plurality of cell strings CS11, CS12, CS21, and CS22. The cell strings CS11, CS12, CS21, and CS22 may be arranged along a row direction and a column direction and may form rows and columns.

For example, the cell strings CS11 and CS12 may be connected to string selection lines SSL1a and SSL1b to form a first row. The cell strings CS21 and CS22 may be connected to string selection lines SSL2a and SSL2b to constitute a second row. For example, the cell strings CS11 and CS21 may be connected to a first bit line BL1 to constitute a first column. The cell strings CS12 and CS22 may be connected to a second bit line BL2 to constitute a second column.

Each of the cell strings CS11, CS12, CS21, and CS22 may include a plurality of cell transistors. Each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. In an embodiment, each of the memory cells included in the cell strings CS11, CS12, CS21, and CS22 may be a charge trap flash (CTF) memory cell.

The memory cells MC1 to MC8 may be serially connected and may be stacked in a height direction being a direction perpendicular to a plane defined by the row direction and the column direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

In an embodiment, a first dummy memory cell DMC1 may be disposed between the memory cells MC1 to MC8 and the ground selection transistors GSTa and GSTb. In an embodiment, a second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to the second ground selection line.

In an embodiment, even though not illustrated in FIG. 23, ground selection transistors provided at the same height from a substrate (not shown) may be connected to the same ground selection line, and ground selection transistors provided at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate (or the ground selection transistors GSTa and GSTb) may be connected in common to the same word line, and memory cells placed at different heights therefrom may be connected to different word lines. For example, the first to eighth memory cells MC1 to MC8 in cell strings CS11, CS12, CS21, and CS22 may be commonly connected the first to eighth word lines WL1 to WL8, respectively.

String selection transistors, belonging to the same row, from among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a and the first string selection transistors SSTa of the cell strings CS21 and CS22 in the second row may be connected in common to the string selection line SSL2a.

String selection transistors, belonging to the same row, from among the second string selection transistors SSTb at the same height may be connected to the same string selection line, and string selection transistors belonging to different rows may be connected to different string selection lines. For example, the second string selection transistors SSTb of the cell strings CS11 and CS12 in the first row may be connected in common to the string selection line SSL1b and the second string selection transistors SSTb of the cell strings CS21 and CS22 in the second row may be connected in common to the string selection line SSL2b.

Even though not shown, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In an embodiment, dummy memory cells at the same height may be connected with the same dummy word line, and dummy memory cells at different heights may be connected with different dummy word lines. For example, the first dummy memory cells DMC1 may be connected to a first dummy word line DWL1 and the second dummy memory cells DMC2 may be connected to a second dummy word line DWL2.

In the first memory block BLK1, read and write operations may be performed by the row. For example, one row of the memory block BLK1 may be selected by the string selection lines SSL1a, SSL1b, SSL2a, and SSL2b. The cell strings CS11 and CS12 in the first row may be respectively connected to the bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 in the second row may be respectively connected to the bit lines BL1 and BL2 when the turn-on voltage is supplied to the string selection lines SSL2a and SSL2b and the turn-off voltage is supplied to the string selection lines SSL1a and SSL1b. Memory cells, belonging to the same height, from among memory cells of a cell string in a row driven by operating a word line may be selected. In selected memory cells, a read and write operation may be performed. The selected memory cells may constitute a physical page unit.

In the memory block BLK1, memory cells may be erased by the memory block or by the sub-block. When erasing is performed by the memory block, all memory cells MC in the memory block BLK1 may be simultaneously erased according to an erase request. When erasing is performed by the sub-block, a portion of memory cells MC in the memory block BLK1 may be simultaneously erased according to an erase request, while the other thereof may be erase-inhibited. A low voltage (e.g., a ground voltage) may be supplied to a word line connected to erased memory cells MC, and a word line connected to erase-inhibited memory cells MC may be floated.

The first memory block BLK1 illustrated in FIG. 23 may be an example. For example, the number of cell strings may increase or decrease, and the number of rows of cell strings and the number of columns of cell strings may increase or decrease according to the number of cell strings. In the first memory block BLK1, the number of cell transistors (GST, MC, DMC, SST, or the like) may increase or decrease, and a height of the first memory block BLK1 may increase or decrease according to the number of cell transistors (GST, MC, DMC, SST, or the like). Furthermore, the number of lines (GSL, WL, DWL, SSL, or the like) connected with cell transistors may increase or decrease according to the number of cell transistors (GST, MC, DMC, SST, or the like).

When memory cells connected to the word line WL5 of the first memory block BLK1 are selected, a non-selection read operation may be applied to at least one of surrounding word lines WL1 to WL4 and WL6 to WL8. In particular, since supplied with a non-selection read voltage Vread2 (>Vread1) of a relatively high level, word lines adjacent to the selected word line WL5 may be influenced by greater read disturbance. According to a read reclaim method of the disclosure, when the first memory block BLK1 is checked as a weak block, a period of a non-selection read operation for the first memory block BLK1 may be changed from a random period to a fixed period. Alternatively, a read reclaim reference for the first memory block BLK1 may be managed to be different from that of other normal blocks.

Figure 24:
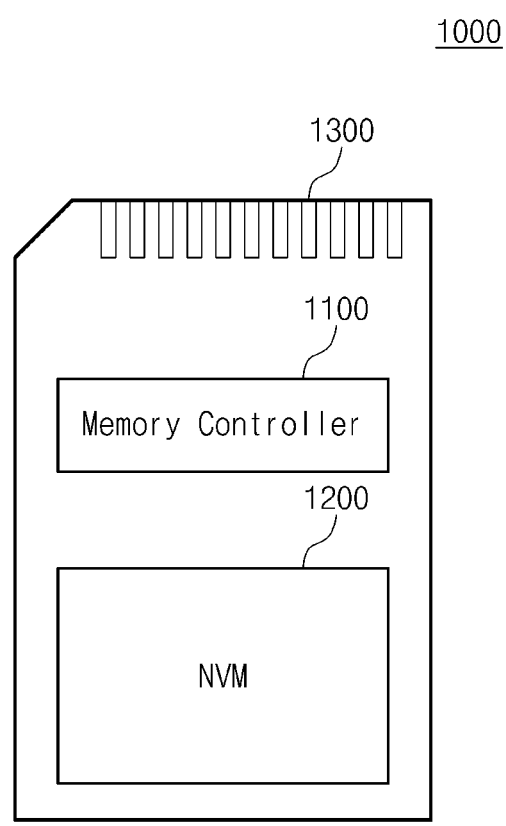
FIG. 24 is a block diagram illustrating a memory card system including a nonvolatile memory system according to an embodiment of the disclosure.

FIG. 24 is a block diagram illustrating a memory card system including a nonvolatile memory system according to an embodiment of the disclosure; Referring to FIG. 24, a memory card system 1000 may include a memory controller 1100, a nonvolatile memory 1200, and a connector 1300.

The memory controller 1100 may be connected to the nonvolatile memory 1200. The memory controller 1100 may be configured to access the nonvolatile memory 1200. For example, the memory controller 1100 may be configured to control an overall operation of the nonvolatile memory 1200 including, but not limited to, a read operation, a write operation, an erase operation, and a background operation. The background operation may include operations such as wear-leveling management and garbage collection. In an embodiment, the memory controller 1100 may perform the same control operation as at least one of the memory controllers 110, 210, and 310 described with reference to FIGS. 1 to 21. That is, the memory controller 1100 may calculate an error bit increase rate based on read counts of memory blocks in the nonvolatile memory device 1200 and may select a weak block based on the calculated error bit increase rate. The memory controller 1100 may designate the selected weak block as a read reclaim block based on a reference (e.g., the number of error bits or a read count) different from other memory blocks.

The memory controller 1100 may provide an interface between the nonvolatile memory 1200 and a host. The memory controller 11000 may be configured to drive firmware for controlling the nonvolatile memory 1200. In an embodiment, the memory controller 1100 may include components such as, but not limited to, a RAM, a processing unit, a host interface, a memory interface, and an error correction unit.

The memory controller 1100 may communicate with an external device through the connector 1300. The memory controller 1100 may communicate with an external device based on a specific communication protocol. For example, the memory controller 1100 may communicate with the external device through at least one of various communication protocols such as, but not limited to, universal serial bus (USB), multimedia card (MMC), eMMC (embedded MMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), Firewire, universal flash storage (UFS), and nonvolatile memory express (NVMe). In an embodiment, a write command defined by the above-described standards may include size information of write data.

The nonvolatile memory 1200 may be implemented with a variety of nonvolatile memory devices, such as, but not limited to, an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 1100 and the nonvolatile memory 1200 may be integrated in a single semiconductor device. The memory controller 1100 and the nonvolatile memory 1200 may be integrated in a single semiconductor device to form a solid state drive (SSD). The memory controller 1100 and the nonvolatile memory 1200 may be integrated in a single semiconductor device to constitute a memory card. For example, the memory controller 1100 and the nonvolatile memory 1200 may be integrated in a single semiconductor device to compose a memory card such as, but not limited to, a PC card (a personal computer memory card international association (PCMCIA) card), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

Figure 25:
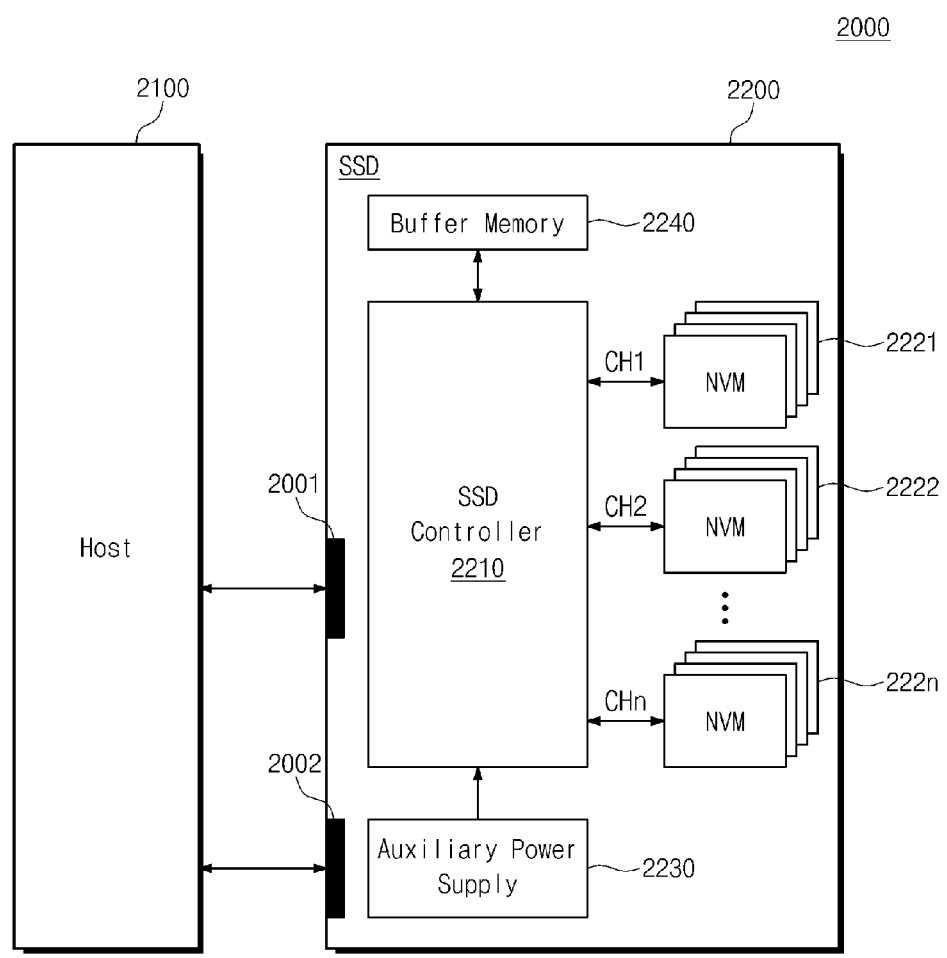
FIG. 25 is a block diagram illustrating a solid state drive including a nonvolatile memory system according to an embodiment of the disclosure.

FIG. 25 is a block diagram illustrating a solid state drive (SSD) including a nonvolatile memory system according to an embodiment of the disclosure. Referring to FIG. 25, a solid state drive (SSD) system 2000 may include a host 2100 and an SSD 2200. The SSD 2200 may exchange signals with the host 2100 through a signal connector 2001 and may be supplied with power through a power connector 2002. The SSD 2200 may include an SSD controller 2210, a plurality of flash memories 2221 to 222n, an auxiliary power supply 2230, and a buffer memory 2240.

The SSD controller 2210 may control the flash memories 2221 to 222n in response to the signal from the host 2100. In an embodiment, the SSD controller 2210 may perform the same control operation as at least one of the memory controllers 110, 210, and 310 described with reference to FIGS. 1 to 21. That is, the SSD controller 2210 may calculate an error bit increase rate based on read counts of the flash memories 221 to 222n and may select a weak block based on the calculated error bit increase rate. The SSD controller 2210 may designate the selected weak block as a read reclaim block based on a reference (e.g., the number of error bits or a read count) different from other memory blocks.

The auxiliary power supply 2230 may be connected to the host 2100 via the power connector 2002. The auxiliary power supply 2230 may be charged by power from the host 2100. When power is not smoothly supplied from the host 2100, the auxiliary power supply 2230 may power the SSD system 2000. The auxiliary power supply 2230 may be placed inside or outside the SSD 2200. For example, the auxiliary power supply 2230 may be put on a main board to supply auxiliary power to the SSD 2200.

The buffer memory 2240 may act as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 222n. The buffer memory 2240 may include volatile memories such as a DRAM, an SDRAM, a DDR SDRAM, an LPDDR SDRAM, and an SRAM or nonvolatile memories such as a FRAM a ReRAM, an STT-MRAM, and a PRAM.

Figure 26:
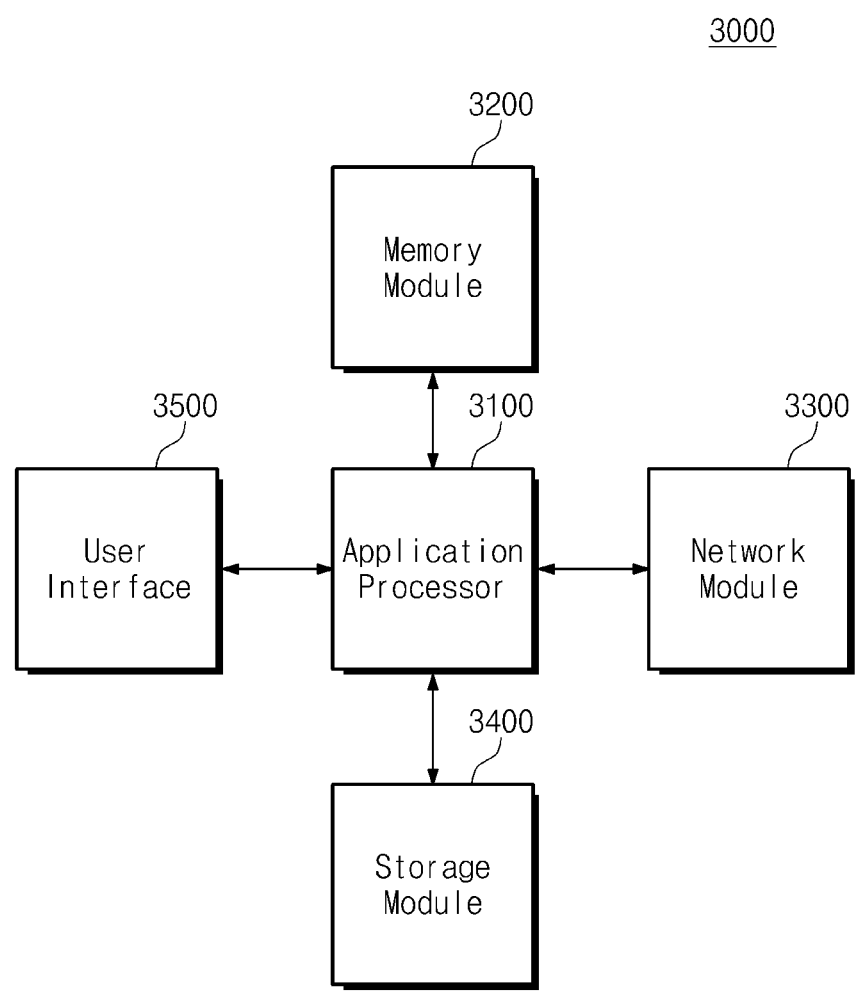
FIG. 26 is a block diagram illustrating a user system including a nonvolatile memory system according to another embodiment of the disclosure.

FIG. 26 is a block diagram illustrating a user system including a nonvolatile memory system according to another embodiment of the disclosure. Referring to FIG. 26, a user system 3000 may include an application processor 3100, a memory module 3200, a network module 3300, a storage module 3400, and a user interface 3500.

The application processor 3100 may drive components, an operating system, and the like of the user system 3000. For example, the application processor 3100 may include controllers for controlling components of the user system 3000, graphics engines, a variety of interfaces, and the like. For example, the application processor 3100 may be a system-on-chip (SoC).

The memory module 3200 may operate as a main memory, a working memory, a buffer memory, or a cache memory of the user system 3000. The memory module 3200 may be implemented with a volatile random access memory, such as a DRAM, an SDRAM, a double date rate DRAM (DDR SDRAM), a DDR2 SDRAM, a DDR3 SDRAM, an LPDDR DRAM, an LPDDR2 DRAM, or an LPDDR3 DRAM or a nonvolatile random access memory, such as a PRAM, an MRAM, an RRAM, or a FRAM.

The network module 3300 may communicate with external devices. For example, the network module 3300 may support wireless communications, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, and WI-DI. In an embodiment, the network module 3300 may be included in the application processor 3100.

The storage module 3400 may store data. For example, the storage module 3400 may store data received from the application processor 3100. Alternatively, the storage module 3400 may provide the application processor 3100 with data stored therein. For example, the storage module 3400 may be implemented with a semiconductor memory device such as a PRAM, an MRAM, an RRAM, a NAND flash memory, a NOR flash memory, or a three-dimensional NAND flash memory.

In an embodiment, the storage module 3400 may control a plurality of nonvolatile memory devices based on a read reclaim manner described with reference to FIGS. 1 to 21.

The user interface 3500 may include interfaces which input data or a command in the application processor 3100 or output data to an external device. For example, the user interface 3500 may include user input interfaces such as a keyboard, a keypad, buttons, a touch panel, a touch screen, a touch pad, a touch ball, a camera, a microphone, a gyroscope sensor, and a vibration sensor. The user interface 3500 may further include user output interfaces such as a liquid crystal display (LCD), an organic light-emitting diode (OLED) display device, an active matrix OLED (AMOLED) display device, a light-emitting diode (LED), a speaker, and a motor.

A nonvolatile memory device, a card controller, and a memory card according to the disclosure may be packaged according to any of a variety of different packaging technologies. Examples of such packaging technologies may include the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

According to embodiments of the disclosure, the number of memory blocks selected as a read reclaim block may be reduced by changing a point in time when a block is designated as a read reclaim block, based on physical characteristics of memory blocks. Accordingly, it may be possible to elongate the life of the storage device and to improve the performance of the storage device.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

What is claimed is:

1. A read reclaim method of a storage device, the method comprising:
   detecting first error bits within first non-selection data stored in each of a plurality of memory blocks of the storage device when a first read count of each of the plurality of memory blocks corresponds to a random number, wherein the first read count of each of the plurality of memory blocks is increased by a first read request;
   selecting, as a weak block, a memory block of the plurality of memory blocks having an increasing rate of the first error bits greater than a reference increasing rate of error bits;
   detecting second error bits within second non-selection data stored in the weak block when a second read count of the weak block corresponds to a fixed number, wherein the second read count of the weak block is increased by a second read request;
   detecting whether a number of the second error bits is greater than or equal to a read reclaim reference value;
   designating the weak block as a read reclaim block when the number of the second error bits is greater than or equal to the read reclaim reference value; and
   performing a read reclaim operation on the read reclaim block to copy data stored in the read reclaim block into a different memory block of the plurality of memory blocks, wherein:
   a memory controller of the storage device is configured to:
   perform a first read operation on the first non-selection data stored in a first page that is unselected by the first read request; and perform a second read operation on the second non-selection data stored in a second page that is unselected by the second read request.

2. The method of claim 1, wherein the fixed number associated with the weak block is shorter than the random number.

3. The method of claim 1, wherein the reference increasing rate of error bits is an average of increasing rates of error bits of the plurality of memory blocks.

4. The method of claim 1, further comprising:
comparing the number of the second error bits with a first threshold value of error bits, wherein
when the number of the second error bits is smaller than or equal to the first threshold value of error bits, the number of the second error bits is detected when the second read count corresponds to the random number.

5. The method of claim 4, wherein when the number of the second error bits is greater than the first threshold value of error bits, the number of the second error bits is detected when the second read count corresponds to the fixed number.

6. The method of claim 1, further comprising designating the weak block as a read reclaim block when the number of the second error bits is greater than or equal to the read reclaim reference value.

7. The method of claim 1, wherein:
each of the plurality of memory blocks comprises a plurality of memory cells, each comprising a charge trap layer,
the memory cells constitute a three-dimensional memory array, and
the first non-selection data is data stored in memory cells selected by a word line that is adjacent to a third page corresponding to the first read request of a host or to a ground selection line or a string selection line.

8. A read reclaim method of a storage device, the method comprising:
detecting, by performing a first read operation, a first number of first error bits of first data stored in each of a plurality of memory blocks;
detecting, by performing a second read operation after the first read operation, a second number of second error bits of second data stored in each of the plurality of memory blocks;
calculating, by using the first number and the second number, an error bit increasing rate of each of the plurality of memory blocks;
classifying each of the plurality of memory blocks into one of a first group and a second group based on the error bit increasing rate;
designating a first memory block of the plurality of memory blocks as a read reclaim block based upon a first read reclaim reference value, wherein the first memory block of the plurality of memory blocks is classified into the first group;
designating a second memory block of the plurality of memory blocks as the read reclaim block based upon a second read reclaim reference value that differs from the first read reclaim reference value, wherein the second memory block of the plurality of memory blocks is classified into the second group; and
performing a read reclaim operation on the read reclaim block to copy data stored in the read reclaim block into a different memory block of the plurality of memory blocks.

9. The method of claim 8, wherein:
the first memory block is designated the read reclaim block when a first detected number of error bits existing in the first memory block exceeds the first read reclaim reference value, and
the second memory block is designated the read reclaim block when a second detected number of error bits existing in the second memory block exceeds the second read reclaim reference value.

10. The method of claim 9, wherein:
the first read reclaim reference value is smaller than the second read reclaim reference value, and
a first error bit increasing rate of the first memory block based on the calculating the error bit increasing rate is greater than a second error bit increasing rate of the second memory block based on the calculating the error bit increasing rate.

11. The method of claim 8, wherein:
the first memory block is designated the read reclaim block when, after the second read operation, a first number of read operations of the first memory block exceeds the first read reclaim reference value, and
the second memory block is designated the read reclaim block when, after the second read operation, a second number of read operations of the second memory block exceeds the second read reclaim reference value.

12. The method of claim 11, wherein:
the first read reclaim reference value is smaller than the second read reclaim reference value, and
the first number of read operations is smaller than the second number of read operations.

13. A storage device comprising:
a nonvolatile memory device comprising a plurality of memory blocks; and
a memory controller configured to:
detect an increasing rate of a number of error bits of data stored in a memory block of the plurality of memory blocks with respect to a random number of read operations requested for the memory block,
designate the memory block as a weak block in response to determining that the increasing rate of the number of error bits of data stored in the memory block exceeds a reference increasing rate of error bits, and
perform a read reclaim operation on the memory block designated as a read reclaim block in response to detecting that, after a fixed number of read operations is performed on the memory block, the memory block designated as the weak block stores a number of error bits exceeding a read reclaim reference value of error bits, for copying data stored in the memory block designated as the read reclaim block into a different memory block of the plurality of memory blocks.

14. The storage device of claim 13, wherein the memory controller comprises a per-block error bit table that stores a count of read operations of each of the plurality of memory blocks and the number of error bits stored by each of the plurality of memory blocks.

15. The storage device of claim 14, wherein the memory controller programs the count of the read operations and the number of error bits for each of the memory blocks in the nonvolatile memory device.

16. The storage device of claim 13, wherein:
the memory block is a first memory block, and
the memory controller assigns a second memory block of the plurality of memory blocks with reference to an attribute or a pattern of write-requested data, wherein the write-requested data is to be stored in the second memory block, and a weak block in which a rate of error bits increase is greater than a reference rate of error bits is assigned to data having an attribute that indicates an update is performed within a reference time.

17. The storage device of claim 16, wherein the memory controller receives attribute information of the write-requested data provided from a host and selects a third memory block of the plurality of memory blocks based on the attribute information, wherein the write-requested data is to be stored in the third memory block.

* * * * *